United States Patent
Nordgren et al.

(10) Patent No.: US 7,554,322 B2
(45) Date of Patent: Jun. 30, 2009

(54) PROBE STATION

(75) Inventors: Greg Nordgren, Wilsonville, OR (US); John Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/083,677

(22) Filed: Mar. 16, 2005

(65) Prior Publication Data

US 2005/0179427 A1 Aug. 18, 2005

Related U.S. Application Data

(63) Continuation of application No. 09/881,312, filed on Jun. 12, 2001, now Pat. No. 6,914,423.

(60) Provisional application No. 60/230,552, filed on Sep. 5, 2000.

(51) Int. Cl.
*G01R 31/28* (2006.01)
(52) U.S. Cl. .................................. 324/158.1
(58) Field of Classification Search ............ 324/754, 324/755–758, 765, 158.1, 760, 761–662; 257/48; 269/55–56; 279/2.19, 19.2–19.3
See application file for complete search history.

(56) References Cited

U.S. PATENT DOCUMENTS

| | | | |
|---|---|---|---|
| 1,337,866 A | 4/1920 | Whitaker |
| 2,142,625 A | 1/1939 | Zoethout |
| 2,197,081 A | 4/1940 | Piron |
| 2,376,101 A | 5/1945 | Tyzzer |
| 2,389,668 A | 11/1945 | Johnson |
| 2,471,897 A | 5/1949 | Rappi |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziejowski |
| 3,258,484 A | 6/1966 | Terry |
| 3,265,969 A | 8/1966 | Catu |
| 3,289,046 A | 11/1966 | Carr |
| 3,333,274 A | 7/1967 | Forcier |
| 3,405,361 A | 10/1968 | Kattner et al. |
| 3,408,565 A | 10/1968 | Frick et al. |
| 3,435,185 A | 3/1969 | Gerard |

(Continued)

FOREIGN PATENT DOCUMENTS

CN          1083975          3/1994

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

(Continued)

*Primary Examiner*—Ha Tran T Nguyen
*Assistant Examiner*—Tung X Nguyen
(74) *Attorney, Agent, or Firm*—Chernoff, Vilhauer, McClung & Stenzel

(57) ABSTRACT

A probe station for testing a wafer.

5 Claims, 15 Drawing Sheets

U.S. PATENT DOCUMENTS

| | | |
|---|---|---|
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,836,751 A | 9/1974 | Anderson |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A | 8/1987 | Gore |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,711,563 A | 12/1987 | Lass |
| 4,712,370 A | 12/1987 | MacGee |
| 4,713,347 A | 12/1987 | Mitchell et al. |
| 4,722,846 A | 2/1988 | Abe et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,795,962 A | 1/1989 | Yanagawa et al. |
| 4,805,627 A | 2/1989 | Klingenbeck et al. |

| | | | | | | |
|---|---|---|---|---|---|---|
| 4,810,981 A | 3/1989 | Herstein | | 5,136,237 A | 8/1992 | Smith et al. |
| 4,812,754 A | 3/1989 | Tracy et al. | | 5,142,224 A | 8/1992 | Smith et al. |
| 4,816,767 A | 3/1989 | Cannon et al. | | 5,144,228 A | 9/1992 | Sorna et al. |
| 4,818,169 A | 4/1989 | Schram et al. | | 5,159,264 A | 10/1992 | Anderson |
| 4,827,211 A | 5/1989 | Strid et al. | | 5,159,267 A | 10/1992 | Anderson |
| 4,831,494 A | 5/1989 | Arnold et al. | | 5,159,752 A | 11/1992 | Mahant-Shetti et al. |
| 4,838,802 A | 6/1989 | Soar | | 5,160,883 A | 11/1992 | Blanz |
| 4,839,587 A | 6/1989 | Flatley et al. | | 5,164,319 A | 11/1992 | Hafeman et al. |
| 4,845,426 A | 7/1989 | Nolan et al. | | 5,164,661 A | 11/1992 | Jones |
| 4,849,689 A | 7/1989 | Gleason | | 5,166,606 A | 11/1992 | Blanz |
| 4,853,613 A | 8/1989 | Sequeira et al. | | 5,172,049 A | 12/1992 | Kiyokawa et al. |
| 4,853,624 A | 8/1989 | Rabjohn | | 5,172,051 A | 12/1992 | Zamborelli |
| 4,853,627 A | 8/1989 | Gleason et al. | | 5,187,443 A | 2/1993 | Bereskin |
| 4,856,426 A | 8/1989 | Wirz | | 5,198,752 A | 3/1993 | Miyata et al. |
| 4,856,904 A | 8/1989 | Akagawa | | 5,198,753 A | 3/1993 | Hamburgen |
| 4,858,160 A | 8/1989 | Strid et al. | | 5,198,756 A | 3/1993 | Jenkins et al. |
| 4,859,989 A | 8/1989 | McPherson | | 5,198,758 A | 3/1993 | Iknaian et al. |
| 4,864,227 A | 9/1989 | Sato | | 5,202,558 A | 4/1993 | Barker |
| 4,871,883 A | 10/1989 | Guiol | | 5,210,377 A | 5/1993 | Kennedy et al. |
| 4,871,965 A | 10/1989 | Elbert et al. | | 5,210,485 A | 5/1993 | Kreiger et al. |
| 4,884,026 A | 11/1989 | Hayakawa et al. | | 5,214,243 A | 5/1993 | Johnson |
| 4,884,206 A | 11/1989 | Mate | | 5,214,374 A | 5/1993 | St. Onge |
| 4,888,550 A | 12/1989 | Reid | | 5,218,185 A | 6/1993 | Gross |
| 4,891,584 A | 1/1990 | Kamieniecki et al. | | 5,220,277 A | 6/1993 | Reitinger |
| 4,893,914 A | 1/1990 | Hancock et al. | | 5,221,905 A | 6/1993 | Bhangu et al. |
| 4,894,612 A | 1/1990 | Drake et al. | | 5,225,037 A | 7/1993 | Elder et al. |
| 4,896,109 A | 1/1990 | Rauscher | | 5,225,796 A | 7/1993 | Williams et al. |
| 4,899,998 A | 2/1990 | Teramachi | | 5,227,730 A | 7/1993 | King et al. |
| 4,904,933 A | 2/1990 | Snyder et al. | | 5,232,789 A | 8/1993 | Platz et al. |
| 4,904,935 A | 2/1990 | Calma et al. | | 5,233,197 A | 8/1993 | Bowman et al. |
| 4,906,920 A | 3/1990 | Huff et al. | | 5,233,306 A | 8/1993 | Misra |
| 4,916,398 A | 4/1990 | Rath | | 5,237,267 A | 8/1993 | Harwood et al. |
| 4,918,279 A | 4/1990 | Babel et al. | | 5,245,292 A | 9/1993 | Milesky et al. |
| 4,918,374 A | 4/1990 | Stewart et al. | | 5,266,889 A | 11/1993 | Harwood et al. |
| 4,918,383 A | 4/1990 | Huff et al. | | 5,267,088 A | 11/1993 | Nomura |
| 4,922,128 A | 5/1990 | Dhong et al. | | 5,270,664 A | 12/1993 | McMurtry et al. |
| 4,922,186 A | 5/1990 | Tsuchiya et al. | | 5,274,336 A | 12/1993 | Crook et al. |
| 4,923,407 A | 5/1990 | Rice et al. | | 5,278,494 A | 1/1994 | Obigane |
| 4,926,118 A | 5/1990 | O'Connor et al. | | 5,280,156 A | 1/1994 | Niori et al. |
| 4,929,893 A | 5/1990 | Sato et al. | | 5,298,972 A | 3/1994 | Heffner |
| 4,933,634 A | 6/1990 | Cuzin et al. | | 5,303,938 A | 4/1994 | Miller et al. |
| 4,968,931 A | 11/1990 | Littlebury et al. | | 5,304,924 A | 4/1994 | Yamano et al. |
| 4,978,907 A | 12/1990 | Smith | | 5,309,088 A | 5/1994 | Chen |
| 4,978,914 A | 12/1990 | Akimoto et al. | | 5,315,237 A | 5/1994 | Iwakura et al. |
| 4,982,153 A | 1/1991 | Collins et al. | | 5,321,352 A | 6/1994 | Takebuchi |
| 4,994,737 A | 2/1991 | Carlton et al. | | 5,321,453 A | 6/1994 | Mori et al. |
| 5,001,423 A | 3/1991 | Abrami et al. | | 5,325,052 A | 6/1994 | Yamashita |
| 5,006,798 A | 4/1991 | Matsuki et al. | | 5,334,931 A | 8/1994 | Clarke et al. |
| 5,010,296 A | 4/1991 | Okada et al. | | 5,336,989 A | 8/1994 | Hofer |
| 5,030,907 A | 7/1991 | Yih et al. | | 5,345,170 A * | 9/1994 | Schwindt et al. ............ 324/754 |
| 5,034,688 A | 7/1991 | Moulene et al. | | 5,357,211 A | 10/1994 | Bryson et al. |
| 5,041,782 A | 8/1991 | Marzan | | 5,363,050 A | 11/1994 | Guo et al. |
| 5,045,781 A | 9/1991 | Gleason et al. | | 5,369,368 A | 11/1994 | Kassen et al. |
| 5,061,823 A | 10/1991 | Carroll | | 5,369,370 A | 11/1994 | Stratmann et al. |
| 5,065,089 A | 11/1991 | Rich | | 5,371,457 A | 12/1994 | Lipp |
| 5,065,092 A | 11/1991 | Sigler | | 5,373,231 A | 12/1994 | Boll et al. |
| 5,066,357 A | 11/1991 | Smyth, Jr. et al. | | 5,374,938 A | 12/1994 | Hatazawa et al. |
| 5,070,297 A | 12/1991 | Kwon et al. | | 5,376,790 A | 12/1994 | Linker et al. |
| 5,077,523 A | 12/1991 | Blanz | | 5,382,898 A | 1/1995 | Subramanian |
| 5,082,627 A | 1/1992 | Stanbro | | 5,397,855 A | 3/1995 | Ferlier |
| 5,084,671 A | 1/1992 | Miyata et al. | | 5,404,111 A | 4/1995 | Mori et al. |
| 5,089,774 A | 2/1992 | Nakano | | 5,408,188 A | 4/1995 | Katoh |
| 5,091,691 A | 2/1992 | Kamieniecki et al. | | 5,408,189 A | 4/1995 | Swart et al. |
| 5,091,692 A | 2/1992 | Ohno et al. | | 5,410,259 A | 4/1995 | Fujihara et al. |
| 5,091,732 A | 2/1992 | Mileski et al. | | 5,412,330 A | 5/1995 | Ravel et al. |
| 5,095,891 A | 3/1992 | Reitter | | 5,412,866 A | 5/1995 | Woith et al. |
| 5,097,207 A | 3/1992 | Blanz | | 5,414,565 A | 5/1995 | Sullivan et al. |
| 5,101,149 A | 3/1992 | Adams et al. | | 5,422,574 A | 6/1995 | Kister |
| 5,101,453 A | 3/1992 | Rumbaugh | | 5,434,512 A | 7/1995 | Schwindt et al. |
| 5,103,169 A | 4/1992 | Heaton et al. | | 5,448,172 A | 9/1995 | Dechene et al. |
| 5,105,148 A | 4/1992 | Lee | | 5,451,884 A | 9/1995 | Sauerland |
| 5,105,181 A | 4/1992 | Ross | | 5,457,398 A * | 10/1995 | Schwindt et al. ............ 324/754 |
| 5,107,076 A | 4/1992 | Bullock et al. | | 5,461,328 A | 10/1995 | Devereaux et al. |

| | | |
|---|---|---|
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouillan et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,521,522 A * | 5/1996 | Abe et al. ................... 324/758 |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,554,236 A | 9/1996 | Singles et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |
| 5,584,608 A | 12/1996 | Gillespie |
| 5,594,358 A | 1/1997 | Ishikawa et al. |
| 5,600,256 A | 2/1997 | Woith et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,628,057 A | 5/1997 | Phillips et al. |
| 5,629,631 A | 5/1997 | Perry et al. |
| 5,631,571 A | 5/1997 | Spaziani et al. |
| 5,633,780 A | 5/1997 | Cronin |
| 5,640,101 A | 6/1997 | Kuji et al. |
| 5,642,298 A | 6/1997 | Mallory et al. |
| 5,644,248 A | 7/1997 | Fujimoto |
| 5,646,538 A | 7/1997 | Lide et al. |
| 5,653,939 A | 8/1997 | Hollis et al. |
| 5,656,942 A | 8/1997 | Watts et al. |
| 5,657,394 A | 8/1997 | Schwartz et al. |
| 5,659,255 A | 8/1997 | Strid et al. |
| 5,659,421 A | 8/1997 | Rahmel et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishaway et al. |
| 5,685,232 A | 11/1997 | Inoue |
| 5,704,355 A | 1/1998 | Bridges |
| 5,712,571 A | 1/1998 | O'Donoghue |
| 5,715,819 A | 2/1998 | Svenson et al. |
| 5,729,150 A | 3/1998 | Schwindt |
| 5,731,708 A | 3/1998 | Sobhami |
| 5,731,920 A | 3/1998 | Katsuragawa |
| 5,744,971 A | 4/1998 | Chan et al. |
| 5,748,506 A | 5/1998 | Bockelman |
| 5,751,252 A | 5/1998 | Phillips |
| 5,767,690 A | 6/1998 | Fujimoto |
| 5,773,951 A | 6/1998 | Markowski et al. |
| 5,777,485 A | 7/1998 | Tanaka et al. |
| 5,792,668 A | 8/1998 | Fuller et al. |
| 5,793,213 A | 8/1998 | Bockelman et al. |
| 5,794,133 A | 8/1998 | Kashima |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,824,494 A | 10/1998 | Feldberg |
| 5,828,225 A | 10/1998 | Obikane et al. |
| 5,829,437 A | 11/1998 | Bridges |
| 5,831,442 A | 11/1998 | Heigl |
| 5,833,601 A | 11/1998 | Swartz et al. |
| 5,835,997 A | 11/1998 | Yassine |
| 5,838,161 A | 11/1998 | Akram et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,857,667 A | 1/1999 | Lee |
| 5,861,743 A | 1/1999 | Pye et al. |
| 5,867,073 A | 2/1999 | Weinreb et al. |
| 5,869,326 A | 2/1999 | Hofmann |
| 5,869,975 A | 2/1999 | Strid et al. |
| 5,874,361 A | 2/1999 | Collins et al. |
| 5,879,289 A | 3/1999 | Yarush et al. |
| 5,883,522 A | 3/1999 | O'Boyle |
| 5,883,523 A | 3/1999 | Ferland et al. |
| 5,888,075 A | 3/1999 | Hasegawa et al. |
| 5,892,539 A | 4/1999 | Colvin |
| 5,900,737 A | 5/1999 | Graham et al. |
| 5,903,143 A | 5/1999 | Mochizuki et al. |
| 5,905,421 A | 5/1999 | Oldfield |
| 5,910,727 A | 6/1999 | Fujihara et al. |
| 5,916,689 A | 6/1999 | Collins et al. |
| 5,923,177 A | 7/1999 | Wardwell |
| 5,926,028 A * | 7/1999 | Mochizuki ................... 324/762 |
| 5,942,907 A | 8/1999 | Chiang |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,952,842 A | 9/1999 | Fujimoto |
| 5,959,461 A | 9/1999 | Brown et al. |
| 5,960,411 A | 9/1999 | Hartman et al. |
| 5,963,027 A | 10/1999 | Peters |
| 5,963,364 A | 10/1999 | Leong et al. |
| 5,970,429 A | 10/1999 | Martin |
| 5,973,505 A | 10/1999 | Strid et al. |
| 5,974,662 A | 11/1999 | Eldridge et al. |
| 5,981,268 A | 11/1999 | Kovacs et al. |
| 5,982,166 A * | 11/1999 | Mautz ................... 324/158.1 |

| | | | | | | |
|---|---|---|---|---|---|---|
| 5,993,611 | A | 11/1999 | Moroney, III et al. | 6,222,970 B1 | 4/2001 | Wach et al. |
| 5,995,914 | A | 11/1999 | Cabot | 6,229,327 B1 | 5/2001 | Boll et al. |
| 5,996,102 | A | 11/1999 | Haulin | 6,232,787 B1 | 5/2001 | Lo et al. |
| 5,998,768 | A | 12/1999 | Hunter et al. | 6,232,788 B1 | 5/2001 | Schwindt et al. |
| 5,999,268 | A | 12/1999 | Yonezawa et al. | 6,232,789 B1 | 5/2001 | Schwindt |
| 6,001,760 | A | 12/1999 | Katsuda et al. | 6,232,790 B1 | 5/2001 | Bryan et al. |
| 6,002,236 | A | 12/1999 | Trant et al. | 6,233,613 B1 | 5/2001 | Walker et al. |
| 6,002,263 | A | 12/1999 | Peters et al. | 6,236,223 B1 | 5/2001 | Brady et al. |
| 6,002,426 | A | 12/1999 | Back et al. | 6,236,975 B1 | 5/2001 | Boe et al. |
| 6,013,586 | A | 1/2000 | McGhee et al. | 6,236,977 B1 | 5/2001 | Verba et al. |
| 6,019,612 | A | 2/2000 | Hasegawa et al. | 6,242,929 B1 | 6/2001 | Mizuta |
| 6,023,209 | A | 2/2000 | Faulkner et al. | 6,245,692 B1 | 6/2001 | Pearce et al. |
| 6,028,435 | A | 2/2000 | Nikawa | 6,251,595 B1 | 6/2001 | Gordon et al. |
| 6,029,141 | A | 2/2000 | Bezos et al. | 6,252,392 B1 | 6/2001 | Peters |
| 6,031,383 | A | 2/2000 | Streib et al. | 6,257,319 B1 | 7/2001 | Kainuma et al. |
| 6,032,714 | A | 3/2000 | Fenton | 6,257,564 B1 | 7/2001 | Avneri et al. |
| 6,034,533 | A | 3/2000 | Tervo et al. | 6,259,261 B1 * | 7/2001 | Engelking et al. ............ 324/754 |
| 6,037,785 | A | 3/2000 | Higgins | 6,265,950 B1 | 7/2001 | Schmidt et al. |
| 6,037,793 | A | 3/2000 | Miyazawa et al. | 6,271,673 B1 | 8/2001 | Furuta et al. |
| 6,043,667 | A | 3/2000 | Cadwallader et al. | 6,275,738 B1 | 8/2001 | Kasevich et al. |
| 6,043,668 | A | 3/2000 | Carney | 6,278,051 B1 | 8/2001 | Peabody |
| 6,049,216 | A | 4/2000 | Yang et al. | 6,278,411 B1 | 8/2001 | Ohlsson et al. |
| 6,051,422 | A | 4/2000 | Kovacs et al. | 6,281,691 B1 | 8/2001 | Matsunaga et al. |
| 6,052,653 | A | 4/2000 | Mazur et al. | 6,284,971 B1 | 9/2001 | Atalar et al. |
| 6,054,869 | A | 4/2000 | Hutton et al. | 6,288,557 B1 | 9/2001 | Peters et al. |
| 6,060,888 | A | 5/2000 | Blackham et al. | 6,292,760 B1 | 9/2001 | Burns |
| 6,060,891 | A | 5/2000 | Hembree et al. | 6,300,775 B1 | 10/2001 | Peach et al. |
| 6,060,892 | A | 5/2000 | Yamagata | 6,307,672 B1 | 10/2001 | DeNure |
| 6,061,589 | A | 5/2000 | Bridges et al. | 6,310,483 B1 | 10/2001 | Taura et al. |
| 6,064,213 | A | 5/2000 | Khandros et al. | 6,310,755 B1 | 10/2001 | Kholodenko et al. |
| 6,064,217 | A | 5/2000 | Smith | 6,313,649 B2 | 11/2001 | Harwood et al. |
| 6,064,218 | A | 5/2000 | Godfrey et al. | 6,320,372 B1 | 11/2001 | Keller |
| 6,066,911 | A | 5/2000 | Lindemann et al. | 6,320,396 B1 | 11/2001 | Nikawa |
| 6,078,183 | A | 6/2000 | Cole, Jr. | 6,327,034 B1 | 12/2001 | Hoover et al. |
| 6,091,236 | A | 7/2000 | Piety et al. | 6,335,625 B1 | 1/2002 | Bryant et al. |
| 6,091,255 | A | 7/2000 | Godfrey | 6,335,628 B2 | 1/2002 | Schwindt et al. |
| 6,096,567 | A | 8/2000 | Kaplan et al. | 6,340,568 B2 | 1/2002 | Hefti |
| 6,100,815 | A | 8/2000 | Pailthorp | 6,340,895 B1 | 1/2002 | Uher et al. |
| 6,104,203 | A | 8/2000 | Costello et al. | 6,359,456 B1 | 3/2002 | Hembree et al. |
| 6,104,206 | A | 8/2000 | Verkuil | 6,362,636 B1 | 3/2002 | Peters et al. |
| 6,111,419 | A | 8/2000 | Lefever et al. | 6,362,792 B1 | 3/2002 | Sawamura et al. |
| 6,114,865 | A | 9/2000 | Lagowski et al. | 6,366,247 B1 | 4/2002 | Sawamura et al. |
| 6,118,287 | A | 9/2000 | Boll et al. | 6,369,776 B1 | 4/2002 | Leisten et al. |
| 6,118,894 | A | 9/2000 | Schwartz et al. | 6,376,258 B1 | 4/2002 | Hefti |
| 6,121,783 | A | 9/2000 | Horner et al. | 6,380,751 B2 | 4/2002 | Harwood et al. |
| 6,124,723 | A | 9/2000 | Costello | 6,384,614 B1 | 5/2002 | Hager et al. |
| 6,124,725 | A | 9/2000 | Sato | 6,395,480 B1 | 5/2002 | Hefti |
| 6,127,831 | A | 10/2000 | Khoury et al. | 6,396,296 B1 | 5/2002 | Tarter et al. |
| 6,130,544 | A | 10/2000 | Strid et al. | 6,396,298 B1 | 5/2002 | Young et al. |
| 6,137,302 | A | 10/2000 | Schwindt | 6,400,168 B2 | 6/2002 | Matsunaga et al. |
| 6,137,303 | A | 10/2000 | Deckert et al. | 6,407,560 B1 | 6/2002 | Walraven et al. |
| 6,144,212 | A | 11/2000 | Mizuta | 6,407,562 B1 | 6/2002 | Whiteman |
| 6,147,502 | A | 11/2000 | Fryer et al. | 6,409,724 B1 | 6/2002 | Penny et al. |
| 6,147,851 | A | 11/2000 | Anderson | 6,404,213 B2 | 7/2002 | Noda |
| 6,160,407 | A | 12/2000 | Nikawa | 6,414,478 B1 | 7/2002 | Suzuki |
| 6,161,294 | A | 12/2000 | Bland et al. | 6,415,858 B1 | 7/2002 | Getchel et al. |
| 6,166,553 | A | 12/2000 | Sinsheimer | 6,418,009 B1 | 7/2002 | Brunette |
| 6,169,410 | B1 | 1/2001 | Grace et al. | 6,420,722 B2 | 7/2002 | Moore et al. |
| 6,172,337 | B1 | 1/2001 | Johnsgard et al. | 6,424,141 B1 | 7/2002 | Hollman et al. |
| 6,175,228 | B1 | 1/2001 | Zamborelli et al. | 6,424,316 B1 | 7/2002 | Leisten et al. |
| 6,181,144 | B1 | 1/2001 | Hembree et al. | 6,445,202 B1 | 9/2002 | Cowan et al. |
| 6,181,149 | B1 | 1/2001 | Godfrey et al. | 6,447,339 B1 | 9/2002 | Reed et al. |
| 6,181,297 | B1 | 1/2001 | Leisten | 6,448,788 B1 | 9/2002 | Meaney et al. |
| 6,181,416 | B1 | 1/2001 | Falk | 6,459,739 B1 | 10/2002 | Vitenberg |
| 6,184,845 | B1 | 2/2001 | Leisten et al. | 6,468,816 B2 | 10/2002 | Hunter |
| 6,191,596 | B1 | 2/2001 | Abiko | 6,476,442 B1 | 11/2002 | Williams et al. |
| 6,194,720 | B1 | 2/2001 | Li et al. | 6,480,013 B1 | 11/2002 | Nayler et al. |
| 6,194,907 | B1 | 2/2001 | Kanao et al. | 6,481,939 B1 | 11/2002 | Gillespie et al. |
| 6,198,299 | B1 | 3/2001 | Hollman | 6,483,327 B1 | 11/2002 | Bruce et al. |
| 6,211,663 | B1 | 4/2001 | Moulthrop et al. | 6,483,336 B1 | 11/2002 | Harris et al. |
| 6,211,837 | B1 | 4/2001 | Crouch et al. | 6,486,687 B2 | 11/2002 | Harwood et al. |
| 6,215,295 | B1 | 4/2001 | Smith, III | 6,488,405 B1 | 12/2002 | Eppes et al. |
| 6,222,031 | B1 | 4/2001 | Wakabayashi et al. | 6,489,789 B2 | 12/2002 | Peters et al. |

| | | | | | | |
|---|---|---|---|---|---|---|
| 6,490,471 B2 | 12/2002 | Svenson et al. | | 6,812,718 B1 | 11/2004 | Chong et al. |
| 6,492,822 B2 | 12/2002 | Schwindt et al. | | 6,822,463 B1 | 11/2004 | Jacobs |
| 6,501,289 B1 | 12/2002 | Takekoshi | | 6,836,135 B2 | 12/2004 | Harris et al. |
| 6,512,391 B2 | 1/2003 | Cowan et al. | | 6,838,885 B2 | 1/2005 | Kamitani |
| 6,512,482 B1 | 1/2003 | Nelson et al. | | 6,842,024 B2 | 1/2005 | Peters et al. |
| 6,515,494 B1 | 2/2003 | Low | | 6,843,024 B2 | 1/2005 | Nozaki et al. |
| 6,528,993 B1 | 3/2003 | Shin et al. | | 6,847,219 B1 | 1/2005 | Lesher et al. |
| 6,529,844 B1 | 3/2003 | Kapetanic et al. | | 6,856,129 B2 | 2/2005 | Thomas et al. |
| 6,548,311 B1 | 4/2003 | Knoll | | 6,861,856 B2 | 3/2005 | Dunklee et al. |
| 6,549,022 B1 | 4/2003 | Cole, Jr. et al. | | 6,864,694 B2 | 3/2005 | McTigue |
| 6,549,026 B1 | 4/2003 | Dibattista et al. | | 6,873,167 B2 | 3/2005 | Goto et al. |
| 6,549,106 B2 | 4/2003 | Martin | | 6,885,197 B2 | 4/2005 | Harris et al. |
| 6,566,079 B2 | 5/2003 | Hefti | | 6,900,646 B2 | 5/2005 | Kasukabe et al. |
| 6,573,702 B2 | 6/2003 | Marcuse et al. | | 6,900,647 B2 | 5/2005 | Yoshida et al. |
| 6,578,264 B1 | 6/2003 | Gleason et al. | | 6,900,652 B2 | 5/2005 | Mazur |
| 6,580,283 B1 | 6/2003 | Carbone et al. | | 6,900,653 B2 | 5/2005 | Yu et al. |
| 6,582,979 B2 | 6/2003 | Coccioli et al. | | 6,902,941 B2 | 6/2005 | Sun |
| 6,587,327 B1 | 7/2003 | Devoe et al. | | 6,903,563 B2 | 6/2005 | Yoshida et al. |
| 6,603,322 B1 | 8/2003 | Boll et al. | | 6,914,244 B2 | 7/2005 | Alani |
| 6,605,951 B1 | 8/2003 | Cowan | | 6,914,580 B2 | 7/2005 | Leisten |
| 6,605,955 B1 | 8/2003 | Costello et al. | | 6,927,079 B1 | 8/2005 | Fyfield |
| 6,608,494 B1 | 8/2003 | Bruce et al. | | 6,937,341 B1 | 8/2005 | Woollam et al. |
| 6,608,496 B1 | 8/2003 | Strid et al. | | 6,970,001 B2 | 11/2005 | Chheda et al. |
| 6,611,417 B2 | 8/2003 | Chen | | 6,987,483 B2 | 1/2006 | Tran |
| 6,617,862 B1 | 9/2003 | Bruce | | 7,001,785 B1 | 2/2006 | Chen |
| 6,621,082 B2 | 9/2003 | Morita et al. | | 7,002,133 B2 | 2/2006 | Beausoleil et al. |
| 6,624,891 B2 | 9/2003 | Marcus et al. | | 7,002,363 B2 | 2/2006 | Mathieu |
| 6,627,461 B2 | 9/2003 | Chapman et al. | | 7,002,364 B2 | 2/2006 | Kang et al. |
| 6,628,503 B2 | 9/2003 | Sogard | | 7,003,184 B2 | 2/2006 | Ronnekleiv et al. |
| 6,628,980 B2 | 9/2003 | Atalar et al. | | 7,005,842 B2 | 2/2006 | Fink et al. |
| 6,633,174 B1 | 10/2003 | Satya et al. | | 7,005,868 B2 | 2/2006 | McTigue |
| 6,636,059 B2 | 10/2003 | Harwood et al. | | 7,005,879 B1 | 2/2006 | Robertazzi |
| 6,636,182 B2 | 10/2003 | Mehltretter | | 7,006,046 B2 | 2/2006 | Aisenbrey |
| 6,639,415 B2 | 10/2003 | Peters et al. | | 7,007,380 B2 | 3/2006 | Das et al. |
| 6,639,461 B1 | 10/2003 | Tam et al. | | 7,009,188 B2 | 3/2006 | Wang |
| 6,642,732 B2 | 11/2003 | Cowan et al. | | 7,009,383 B2 | 3/2006 | Harwood et al. |
| 6,643,597 B1 | 11/2003 | Dunsmore | | 7,009,415 B2 | 3/2006 | Kobayashi et al. |
| 6,653,903 B2 | 11/2003 | Leich et al. | | 7,011,531 B2 | 3/2006 | Egitto et al. |
| 6,657,601 B2 | 12/2003 | McLean | | 7,012,425 B2 | 3/2006 | Shoji |
| 6,686,753 B1 | 2/2004 | Kitahata | | 7,012,441 B2 | 3/2006 | Chou et al. |
| 6,701,265 B2 | 3/2004 | Hill et al. | | 7,013,221 B1 | 3/2006 | Friend et al. |
| 6,707,548 B2 | 3/2004 | Kreimer et al. | | 7,014,499 B2 | 3/2006 | Yoon |
| 6,710,798 B1 | 3/2004 | Hershel et al. | | 7,015,455 B2 | 3/2006 | Mitsuoka et al. |
| 6,717,426 B2 | 4/2004 | Iwasaki | | 7,015,689 B2 | 3/2006 | Kasajima et al. |
| 6,720,782 B2 | 4/2004 | Schwindt et al. | | 7,015,690 B2 | 3/2006 | Wang et al. |
| 6,724,205 B1 | 4/2004 | Hayden et al. | | 7,015,703 B2 | 3/2006 | Hopkins et al. |
| 6,724,928 B1 | 4/2004 | Davis | | 7,015,707 B2 | 3/2006 | Cherian |
| 6,727,716 B1 | 4/2004 | Sharif | | 7,015,708 B2 | 3/2006 | Beckous et al. |
| 6,731,804 B1 | 5/2004 | Carrieri et al. | | 7,015,709 B2 | 3/2006 | Capps et al. |
| 6,734,687 B1 | 5/2004 | Ishitani et al. | | 7,015,710 B2 | 3/2006 | Yoshida et al. |
| 6,737,920 B2 | 5/2004 | Jen et al. | | 7,015,711 B2 | 3/2006 | Rothaug et al. |
| 6,739,208 B2 | 5/2004 | Hyakudomi | | 7,019,541 B2 | 3/2006 | Kittrell |
| 6,744,268 B2 | 6/2004 | Hollman | | 7,019,544 B1 | 3/2006 | Jacobs et al. |
| 6,753,679 B1 | 6/2004 | Kwong et al. | | 7,019,701 B2 | 3/2006 | Ohno et al. |
| 6,753,699 B2 | 6/2004 | Stockstad | | 7,020,360 B2 | 3/2006 | Satomura et al. |
| 6,756,751 B2 | 6/2004 | Hunter | | 7,020,363 B2 | 3/2006 | Johannessen |
| 6,768,328 B2 | 7/2004 | Self et al. | | 7,022,976 B1 | 4/2006 | Santana, Jr. et al. |
| 6,770,955 B1 | 8/2004 | Coccioli et al. | | 7,022,985 B2 | 4/2006 | Knebel et al. |
| 6,771,090 B2 | 8/2004 | Harris et al. | | 7,023,225 B2 | 4/2006 | Blackwood |
| 6,771,806 B1 | 8/2004 | Satya et al. | | 7,023,226 B2 | 4/2006 | Okumura et al. |
| 6,774,651 B1 | 8/2004 | Hembree | | 7,023,229 B2 | 4/2006 | Maesaki et al. |
| 6,777,964 B2 | 8/2004 | Navratil et al. | | 7,023,231 B2 | 4/2006 | Howland, Jr. et al. |
| 6,778,140 B1 | 8/2004 | Yeh | | 7,025,628 B2 | 4/2006 | LaMeres et al. |
| 6,784,679 B2 | 8/2004 | Sweet et al. | | 7,026,832 B2 | 4/2006 | Chaya et al. |
| 6,788,093 B2 | 9/2004 | Aitren et al. | | 7,026,833 B2 | 4/2006 | Rincon et al. |
| 6,791,344 B2 | 9/2004 | Cook et al. | | 7,026,834 B2 | 4/2006 | Hwang |
| 6,794,888 B2 | 9/2004 | Kawaguchi et al. | | 7,026,835 B2 | 4/2006 | Farnworth et al. |
| 6,794,950 B2 | 9/2004 | Du Toit et al. | | 7,030,599 B2 | 4/2006 | Douglas |
| 6,798,226 B2 | 9/2004 | Altmann et al. | | 7,030,827 B2 | 4/2006 | Mahler et al. |
| 6,801,047 B2 | 10/2004 | Harwood et al. | | 7,032,307 B2 | 4/2006 | Matsunaga et al. |
| 6,806,724 B2 | 10/2004 | Hayden et al. | | 7,034,553 B2 | 4/2006 | Gilboe |
| 6,806,836 B2 | 10/2004 | Ogawa et al. | | 7,035,738 B2 | 4/2006 | Matsumoto et al. |
| 6,809,533 B1 | 10/2004 | Anlage et al. | | 7,088,981 B2 | 8/2006 | Chang |

| | | | | | | |
|---|---|---|---|---|---|---|
| 7,096,133 | B1 | 8/2006 | Martin et al. | 2004/0186382 A1 | 9/2004 | Modell et al. |
| 7,101,797 | B2 | 9/2006 | Yuasa | 2004/0193382 A1 | 9/2004 | Adamian et al. |
| 7,138,813 | B2 | 11/2006 | Cowan et al. | 2004/0197771 A1 | 10/2004 | Powers et al. |
| 7,187,188 | B2 | 3/2007 | Andrews et al. | 2004/0199350 A1 | 10/2004 | Blackham et al. |
| 7,188,037 | B2 | 3/2007 | Hidehira | 2004/0207072 A1 | 10/2004 | Hiramatsu et al. |
| 7,362,115 | B2 | 4/2008 | Andrews et al. | 2004/0207424 A1 | 10/2004 | Hollman |
| 2001/0002794 | A1 | 6/2001 | Draving et al. | 2004/0239338 A1 | 12/2004 | Johnsson et al. |
| 2001/0009377 | A1 | 7/2001 | Schwindt et al. | 2004/0246004 A1 | 12/2004 | Heuermann |
| 2001/0010468 | A1 | 8/2001 | Gleason et al. | 2004/0251922 A1 | 12/2004 | Martens et al. |
| 2001/0020283 | A1 | 9/2001 | Sakaguchi | 2004/0267691 A1 | 12/2004 | Vasudeva |
| 2001/0024116 | A1 | 9/2001 | Draving | 2005/0024069 A1 | 2/2005 | Hayden et al. |
| 2001/0030549 | A1 | 10/2001 | Gleason et al. | 2005/0026276 A1 | 2/2005 | Chou |
| 2001/0043073 | A1 | 11/2001 | Montoya | 2005/0030047 A1 | 2/2005 | Adamian |
| 2001/0044152 | A1 | 11/2001 | Burnett | 2005/0054029 A1 | 3/2005 | Tomimatsu et al. |
| 2001/0045511 | A1 | 11/2001 | Moore et al. | 2005/0062533 A1 | 3/2005 | Vice |
| 2001/0054906 | A1 | 12/2001 | Fujimura | 2005/0083130 A1 | 4/2005 | Grilo |
| 2002/0005728 | A1 | 1/2002 | Babson et al. | 2005/0099192 A1 | 5/2005 | Dunklee et al. |
| 2002/0008533 | A1 | 1/2002 | Ito et al. | 2005/0101846 A1 | 5/2005 | Fine et al. |
| 2002/0009377 | A1 | 1/2002 | Shafer | 2005/0156675 A1 | 7/2005 | Rohde et al. |
| 2002/0009378 | A1 | 1/2002 | Obara | 2005/0164160 A1 | 7/2005 | Gunter et al. |
| 2002/0011859 | A1 | 1/2002 | Smith et al. | 2005/0165316 A1 | 7/2005 | Lowery et al. |
| 2002/0011863 | A1 | 1/2002 | Takahashi et al. | 2005/0168722 A1 | 8/2005 | Forstner et al. |
| 2002/0050828 | A1 | 5/2002 | Seward, IV et al. | 2005/0174191 A1 | 8/2005 | Brunker et al. |
| 2002/0066551 | A1 | 6/2002 | Stone et al. | 2005/0178980 A1 | 8/2005 | Skidmore et al. |
| 2002/0070743 | A1 | 6/2002 | Felici et al. | 2005/0195124 A1 | 9/2005 | Puente Baliarda et al. |
| 2002/0070745 | A1 | 6/2002 | Johnson et al. | 2005/0227503 A1 | 10/2005 | Reitinger |
| 2002/0075027 | A1 | 6/2002 | Hollman et al. | 2005/0236587 A1 | 10/2005 | Kodama et al. |
| 2002/0079911 | A1 | 6/2002 | Schwindt | 2005/0237102 A1 | 10/2005 | Tanaka |
| 2002/0118009 | A1 | 8/2002 | Hollman et al. | 2006/0052075 A1 | 3/2006 | Galivanche et al. |
| 2002/0118034 | A1 | 8/2002 | Laureanti | 2006/0114012 A1 | 6/2006 | Reitinger |
| 2002/0149377 | A1 | 10/2002 | Hefti et al. | 2006/0155270 A1 | 7/2006 | Hancock et al. |
| 2002/0153909 | A1 | 10/2002 | Petersen et al. | 2006/0158207 A1 | 7/2006 | Reitinger |
| 2002/0163769 | A1 | 11/2002 | Brown | 2006/0226864 A1 | 10/2006 | Kramer |
| 2002/0168659 | A1 | 11/2002 | Hefti et al. | 2007/0024506 A1 | 2/2007 | Hardacker |
| 2002/0180466 | A1 | 12/2002 | Hiramatsu et al. | 2007/0030021 A1 | 2/2007 | Cowan et al. |
| 2002/0197709 | A1 | 12/2002 | Van der Weide et al. | | | |
| 2003/0010877 | A1 | 1/2003 | Landreville et al. | | | |

FOREIGN PATENT DOCUMENTS

| | | |
|---|---|---|
| DE | 29 12 826 | 10/1980 |
| DE | 31 14 466 | 3/1982 |
| DE | 31 25 552 | 11/1982 |
| DE | 3637549 | 5/1988 |
| DE | 41 09 908 | 10/1992 |
| DE | 93 13 420.7 | 12/1993 |
| DE | 43 16 111 | 11/1994 |
| DE | 288 234 | 3/1995 |
| DE | 94 06 227 | 10/1995 |
| DE | 195 41 334 | 9/1996 |
| DE | 196 16 212 | 10/1996 |
| DE | 19522774 | 1/1997 |
| DE | 196 18 717 | 1/1998 |
| DE | 693 22 206 | 4/1999 |
| DE | 10000324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 505 981 | 3/1992 |
| EP | 0 574 149 A1 | 5/1993 |
| EP | 0 574 149 | 12/1993 |
| EP | 0 706 210 | 4/1996 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-11243 | 1/1987 |

| | | | | |
|---|---|---|---|---|
| 2003/0030822 | A1 | 2/2003 | Finarov | |
| 2003/0032000 | A1 | 2/2003 | Liu et al. | |
| 2003/0040004 | A1 | 2/2003 | Hefti et al. | |
| 2003/0057513 | A1 | 3/2003 | Leedy | |
| 2003/0062915 | A1 | 4/2003 | Arnold et al. | |
| 2003/0071631 | A1 | 4/2003 | Alexander | |
| 2003/0072549 | A1 | 4/2003 | Facer et al. | |
| 2003/0077649 | A1 | 4/2003 | Cho et al. | |
| 2003/0088180 | A1 | 5/2003 | VanVeen et al. | |
| 2003/0119057 | A1 | 6/2003 | Gascoyne et al. | |
| 2003/0139662 | A1 | 7/2003 | Seidman | |
| 2003/0139790 | A1 | 7/2003 | Ingle et al. | |
| 2003/0141861 | A1 | 7/2003 | Navratil et al. | |
| 2003/0155939 | A1 | 8/2003 | Lutz et al. | |
| 2003/0156270 | A1 | 8/2003 | Hunter | |
| 2003/0170898 | A1 | 9/2003 | Gunderson et al. | |
| 2003/0184332 | A1 | 10/2003 | Tomimatsu et al. | |
| 2004/0015060 | A1 | 1/2004 | Samsoondar et al. | |
| 2004/0021475 | A1 | 2/2004 | Ito et al. | |
| 2004/0061514 | A1 | 4/2004 | Schwindt et al. | |
| 2004/0066181 | A1 | 4/2004 | Thies | |
| 2004/0069776 | A1 | 4/2004 | Fagrell et al. | |
| 2004/0090223 | A1 | 5/2004 | Yonezawa | |
| 2004/0095145 | A1 | 5/2004 | Boudiaf et al. | |
| 2004/0095641 | A1 | 5/2004 | Russum et al. | |
| 2004/0100276 | A1 | 5/2004 | Fanton | |
| 2004/0100297 | A1 | 5/2004 | Tanioka et al. | |
| 2004/0108847 | A1 | 6/2004 | Stoll et al. | |
| 2004/0113639 | A1 | 6/2004 | Dunklee et al. | |
| 2004/0113640 | A1 | 6/2004 | Cooper et al. | |
| 2004/0130787 | A1 | 7/2004 | Thome-Forster et al. | |
| 2004/0132222 | A1 | 7/2004 | Hembree et al. | |
| 2004/0134899 | A1 | 7/2004 | Hiramatsu et al. | |
| 2004/0162689 | A1 | 8/2004 | Jamneala et al. | |
| 2004/0175294 | A1 | 9/2004 | Ellison et al. | |
| 2004/0167034 | A1 | 7/2004 | Gore et al. | |

| | | |
|---|---|---|
| JP | 62-011243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-8476 | 2/1993 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7005078 | 1/1995 |
| JP | 7-84003 | 3/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2001-358184 | 12/2001 |
| JP | 2002033374 | 1/2002 |
| JP | 2002/164396 | 6/2002 |
| JP | 2002-164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak to analytical probe stations," MicroProbe Update, May 1990.

H.-J. Eul and B. Schiek, "Thru-Match-Reflect: One Result of a Rigorous Theory for De-Embedding and Network Analyzer Calibration," 18$^{th}$ Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Hewlett Packard, "HP 4284A Precision LCR Meter Operation Manual (Including Option 001,002,008,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-68.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between -196 and 350° C," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Mark S. Boguski & Martin W. McIntosh, "Biomedical informatics for proteomics," Insight: review article, Nature 422, Mar. 13, 2003, pp. 233-237.

The Micromanipulator Company, Inc., "Model 8000 Test Station," 1986, 1 page.

The Micromanipulator Company, Inc. "Model 8000 Test Station," 1988, 1 page.

Microwave Products, Microwave Journal, Sep. 1988, 1 page.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Waveguide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA, 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

* cited by examiner

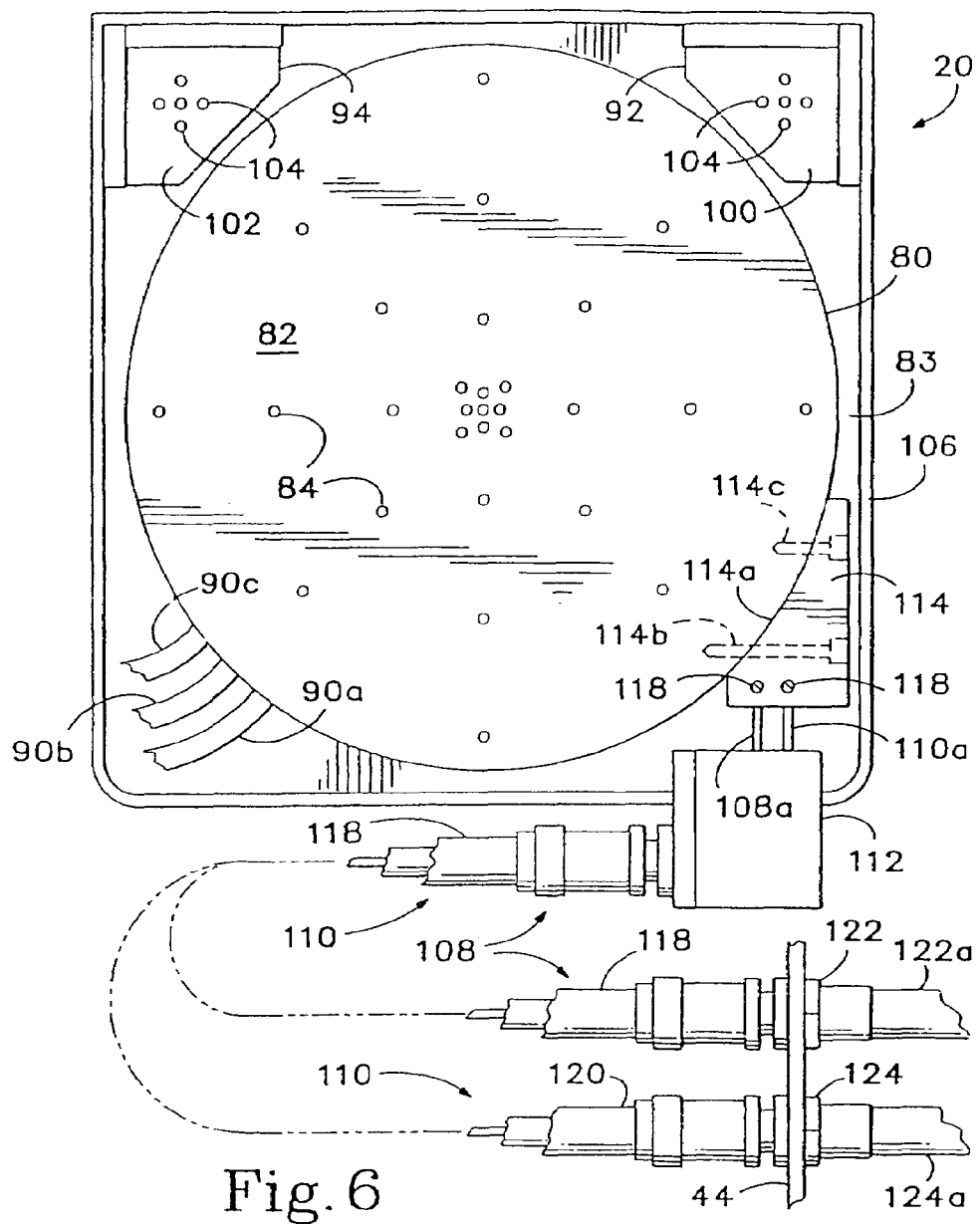
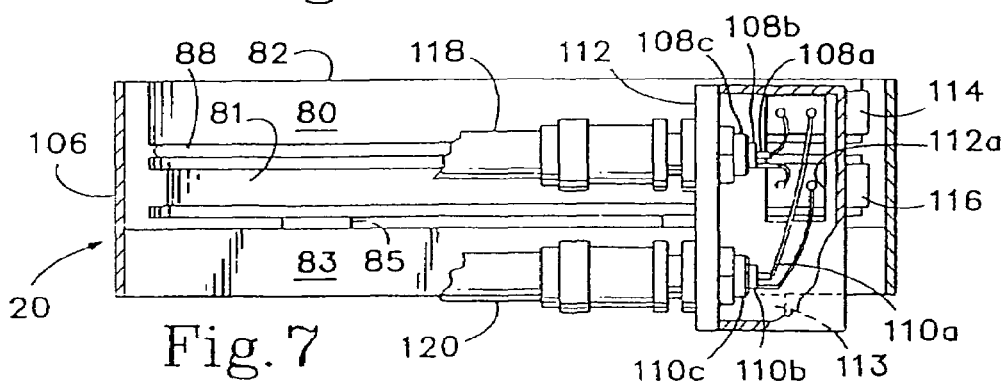
Fig. 6
Fig. 7

PROBE STATION

CROSS REFERENCE TO RELATED APPLICATIONS

This application is a continuation of application Ser. No. 09/881,312, filed on Jun. 12, 2001, now U.S. Pat. No. 6,914,423 B2, which claims the benefit of U.S. Provisional Application No. 60/230,552, filed Sep. 5, 2000.

BACKGROUND OF THE INVENTION

The present application relates to a probe station.

With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck-assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e., horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes, respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing-housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably, the spacers and washers 85 and 86, respectively, are constructed of a material having the lowest possible dielectric constant consistent with high dimensional stability and high volume resistivity. A suitable material for the spacers and washers is glass epoxy, or acetyl homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b. U.S. Pat. No. 5,532,609 discloses a probe station and chuck and is hereby incorporated by reference.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 2A is a partial top view of the wafer probe station of FIG. 1 with the enclosure door shown partially open.

FIG. 3A is an enlarged sectional view taken along line 3A-3A of FIG. 3.

FIG. 6 is a partially schematic top detail view of the chuck assembly, taken along line 6—6 of FIG. 3.

FIG. 7 is a partially sectional front view of the chuck assembly of FIG. 6.

DETAILED DESCRIPTION OF THE PREFERRED EMBODIMENT

The probes may be calibrated by using test structures on the calibration substrates supported by the auxiliary chucks 92 and 94. During calibration the chuck assembly 20, as previously described in the background, is normally aligned with the probes. A wafer placed on the chuck assembly 20 is not normally accurately aligned with the auxiliary chucks 92 and 94, and hence the probes. In order to test the wafer the entire chuck assembly 20, including the auxiliary chucks 92 and 94, is rotated to align the wafer with the positioners 24 and their respective probes. Typically, during testing the chuck assembly 20 is rotated to realign the test structures on the calibration substrates supported by the auxiliary chucks 92 and 94 with the probes. After further calibration, the entire chuck assembly 20, including the auxiliary chucks 92 and 94, is again rotated to align the wafer with the positioners 24 and their respective probes. Unfortunately, the theta adjustment of the chuck assembly 20 may not be sufficiently accurate for increasingly small device structures. Multiple theta adjustments of the chuck assembly 20 may result in a slight misalignment of the chuck assembly 20. As a result of such misalignment it may become necessary for the operator to painstakingly manually adjust the theta orientation of the chuck assembly 20.

Smaller environmental control enclosures require less time to create suitable environmental conditions within the environmental control enclosure for accurate measurements. The environmental control enclosure is sufficiently large to permit the chuck assembly to move the entire wafer under the probes for testing. However, if the chuck assembly 20 is rotatable with respect to the environmental control enclosure then the environmental control enclosure needs additional width to prevent the corners of the chuck assembly 20 from impacting the sides of the environmental control enclosure.

Normally the encoders within the stage supporting the chuck assembly include software based compensation for non-proportional movement to achieve accurate movement in the X and Y directions over the entire range of movement. The software compensation of the encoders also depends on the X and Y position of the chuck relative to the probes. In other words, at different X and Y positions over the entire range of movement of the chuck the amount of compensation provided to the encoders may vary. This variable compensation depending on the X and Y position of the chuck results in complicated spatial calculations for appropriate encoder control. The spatial calculations are further complicated when the chuck is rotated to accommodate the auxiliary chuck calibration.

Figure 1:
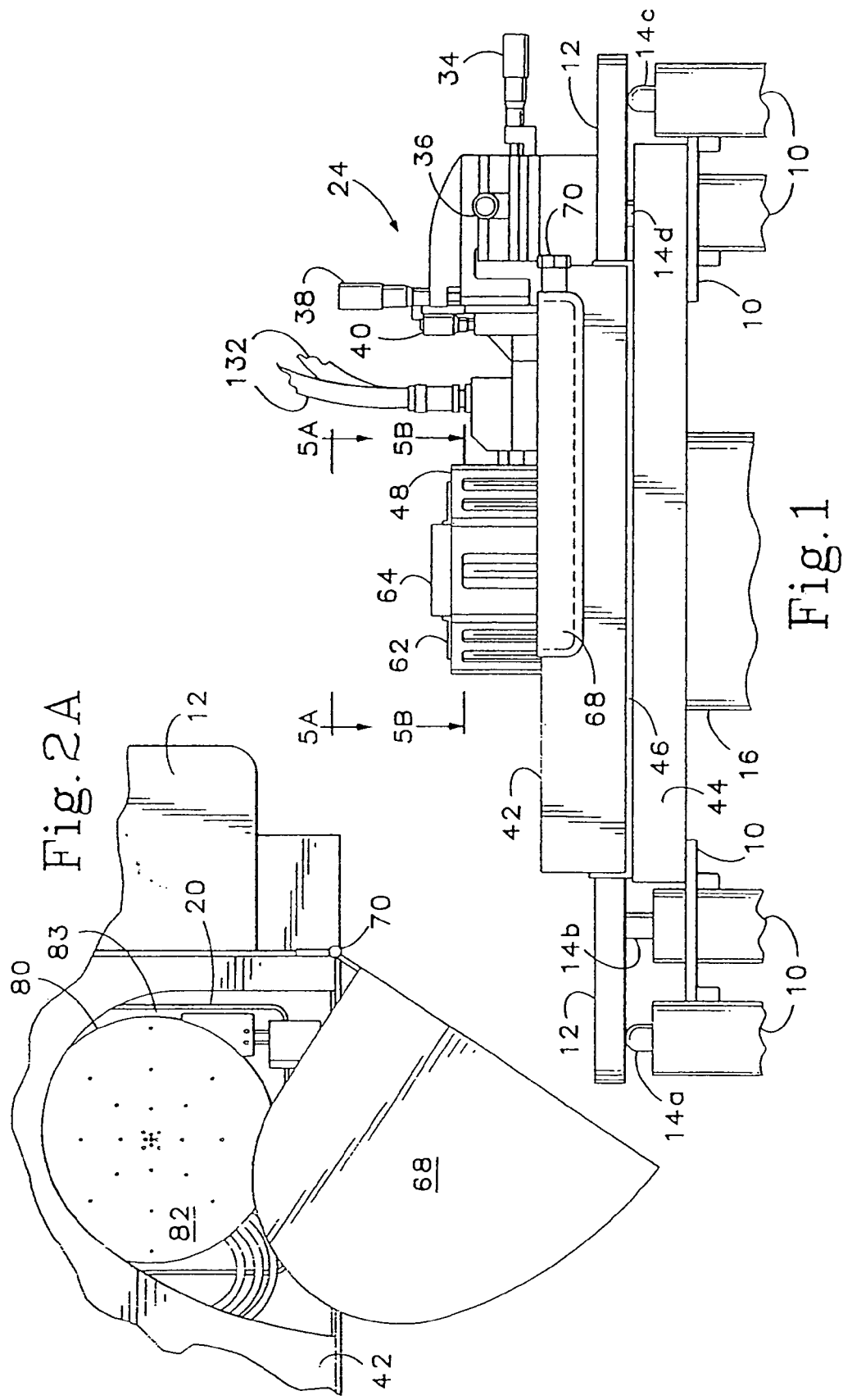
FIG. 1 is a partial front view of an exemplary embodiment of a wafer probe station constructed in accordance with the present invention.
Figure 2:
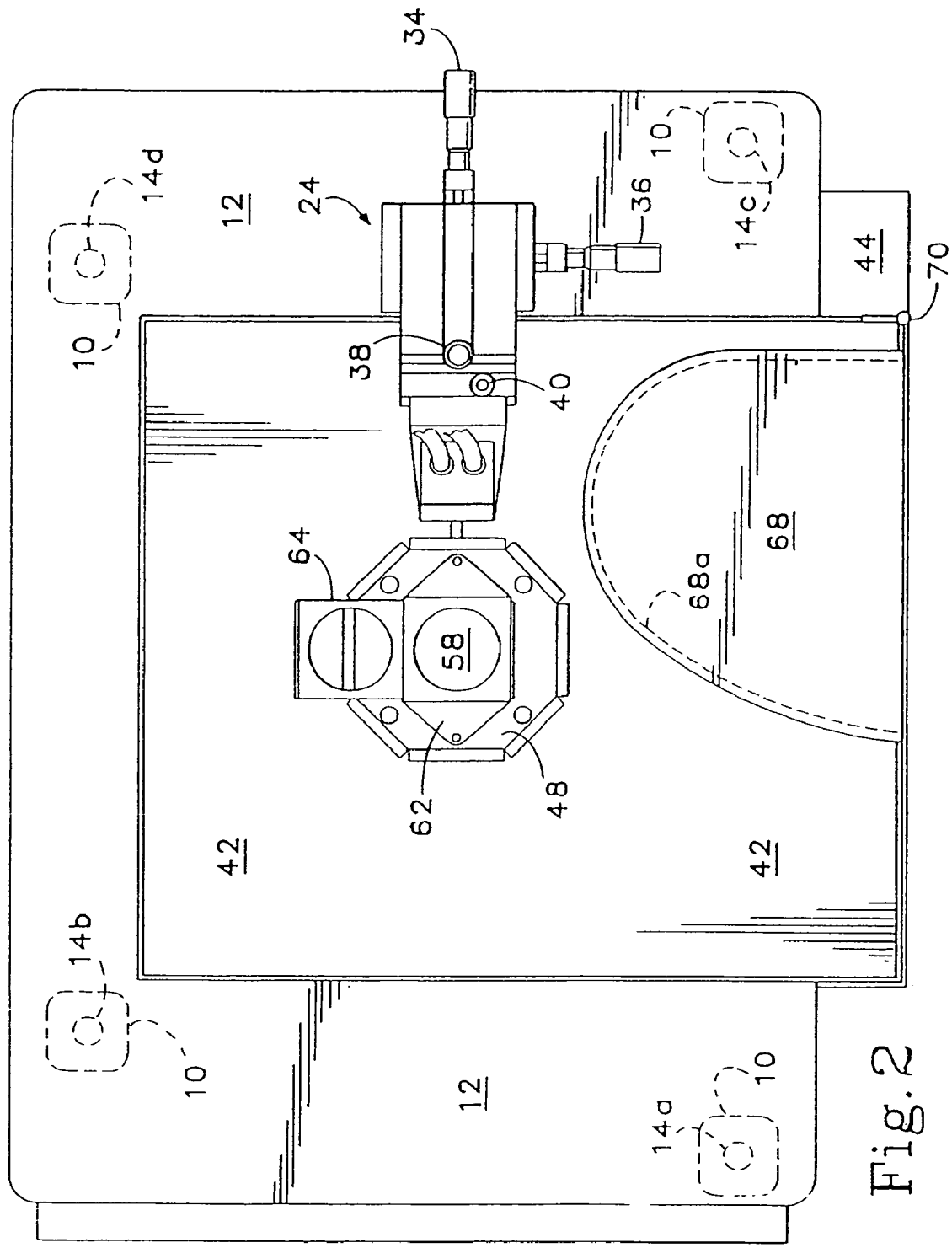
FIG. 2 is a top view of the wafer probe station of FIG. 1.
Figure 3:
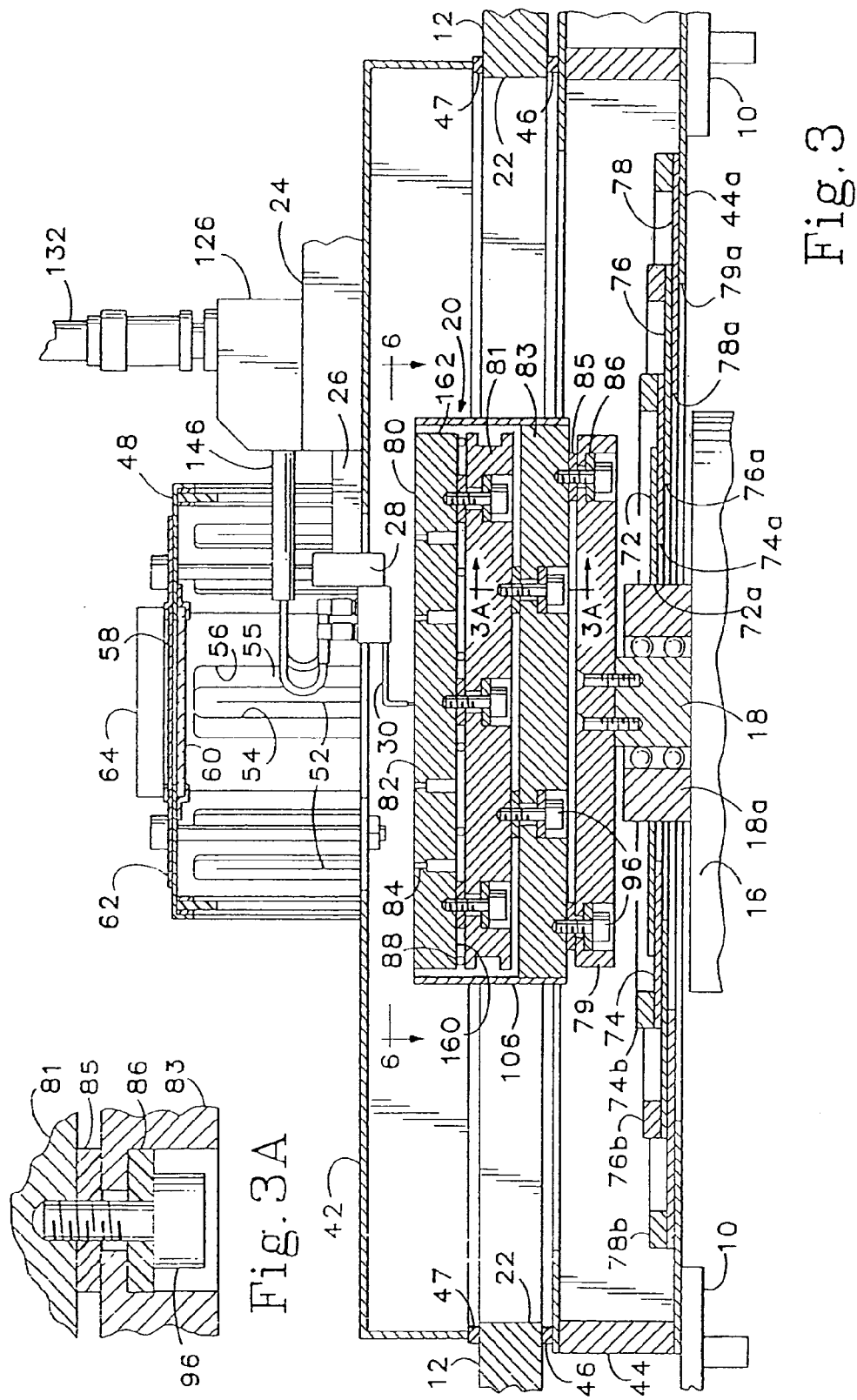
FIG. 3 is a partially sectional and partially schematic front view of the probe station of FIG. 1.
Figure 4:
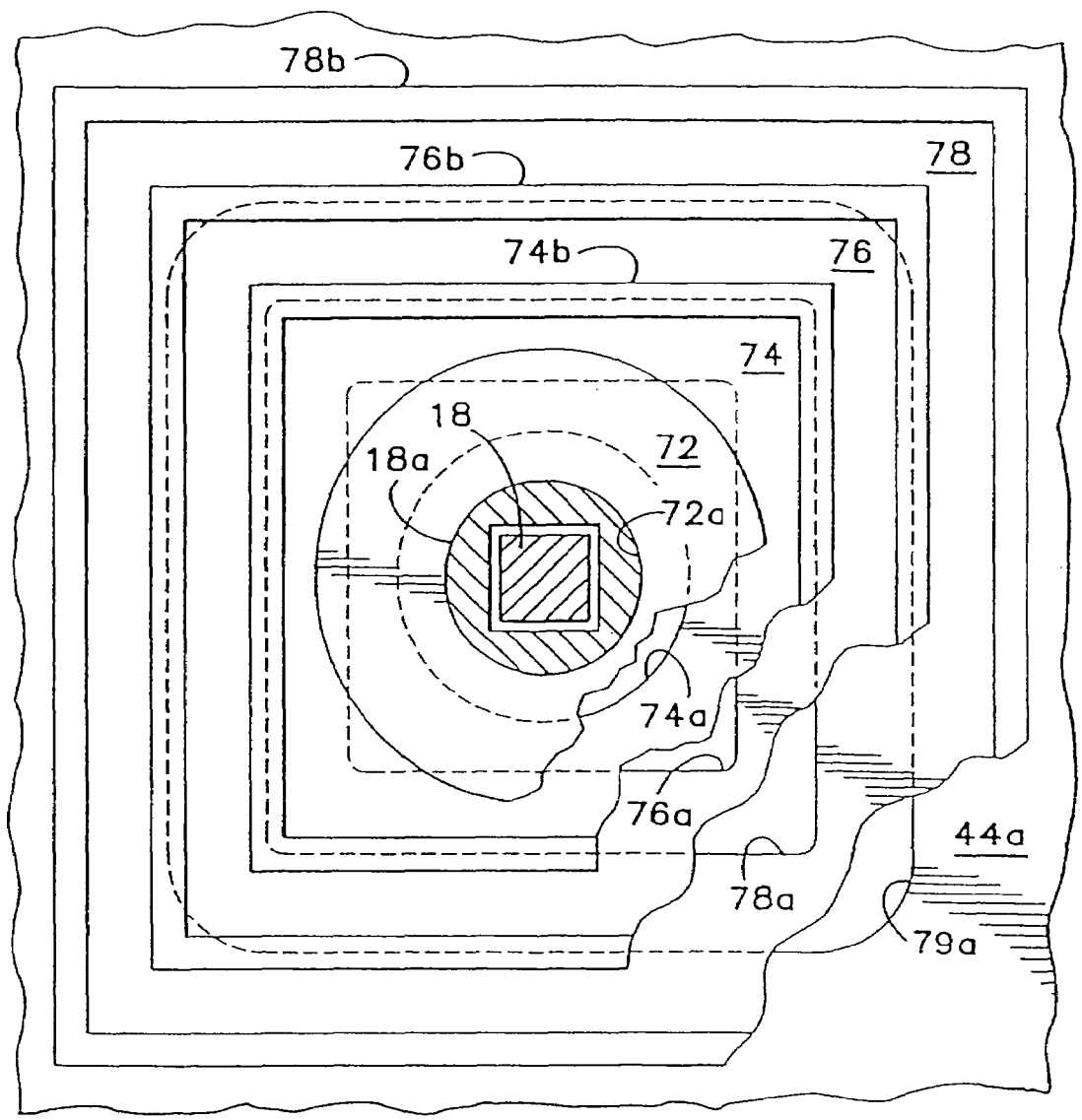
FIG. 4 is a top view of the sealing assembly where the motorized positioning mechanism extends through the bottom of the enclosure.
Figure 5A:
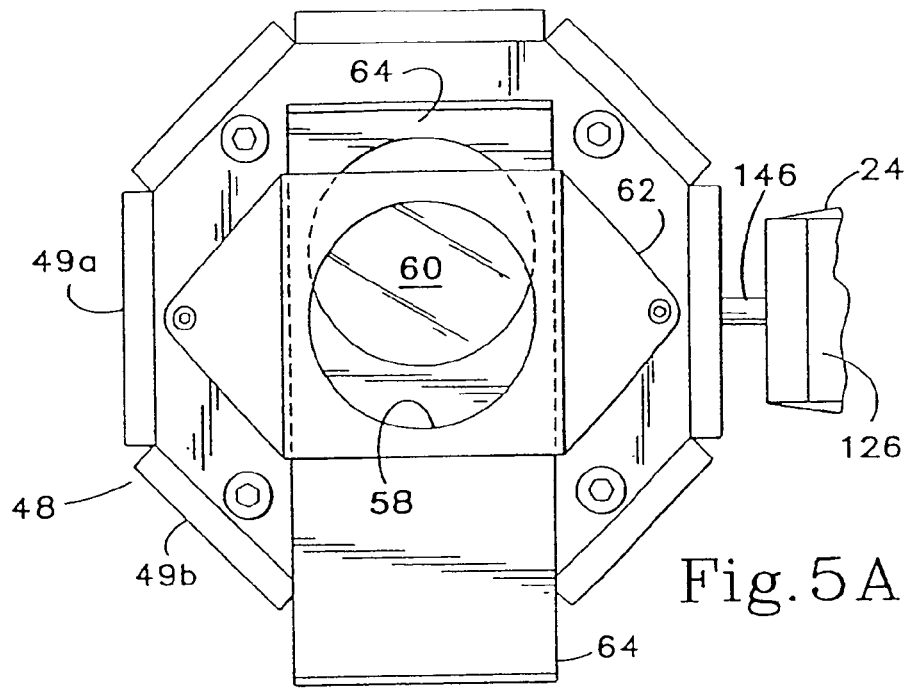
FIG. 5A is an enlarged top detail view taken along line 5A-5A of FIG. 1.
Figure 5B:
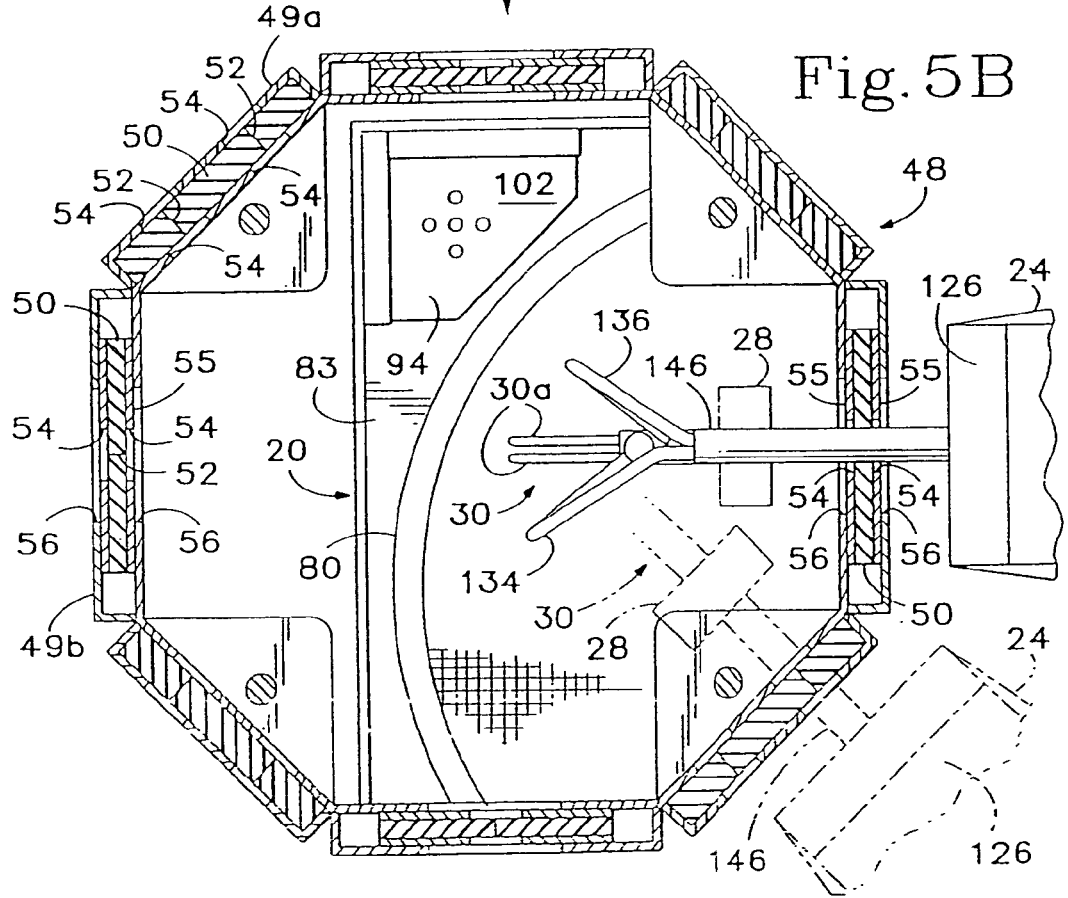
FIG. 5B is an enlarged top sectional view taken along line 5B-5B of FIG. 1.
Figure 8:
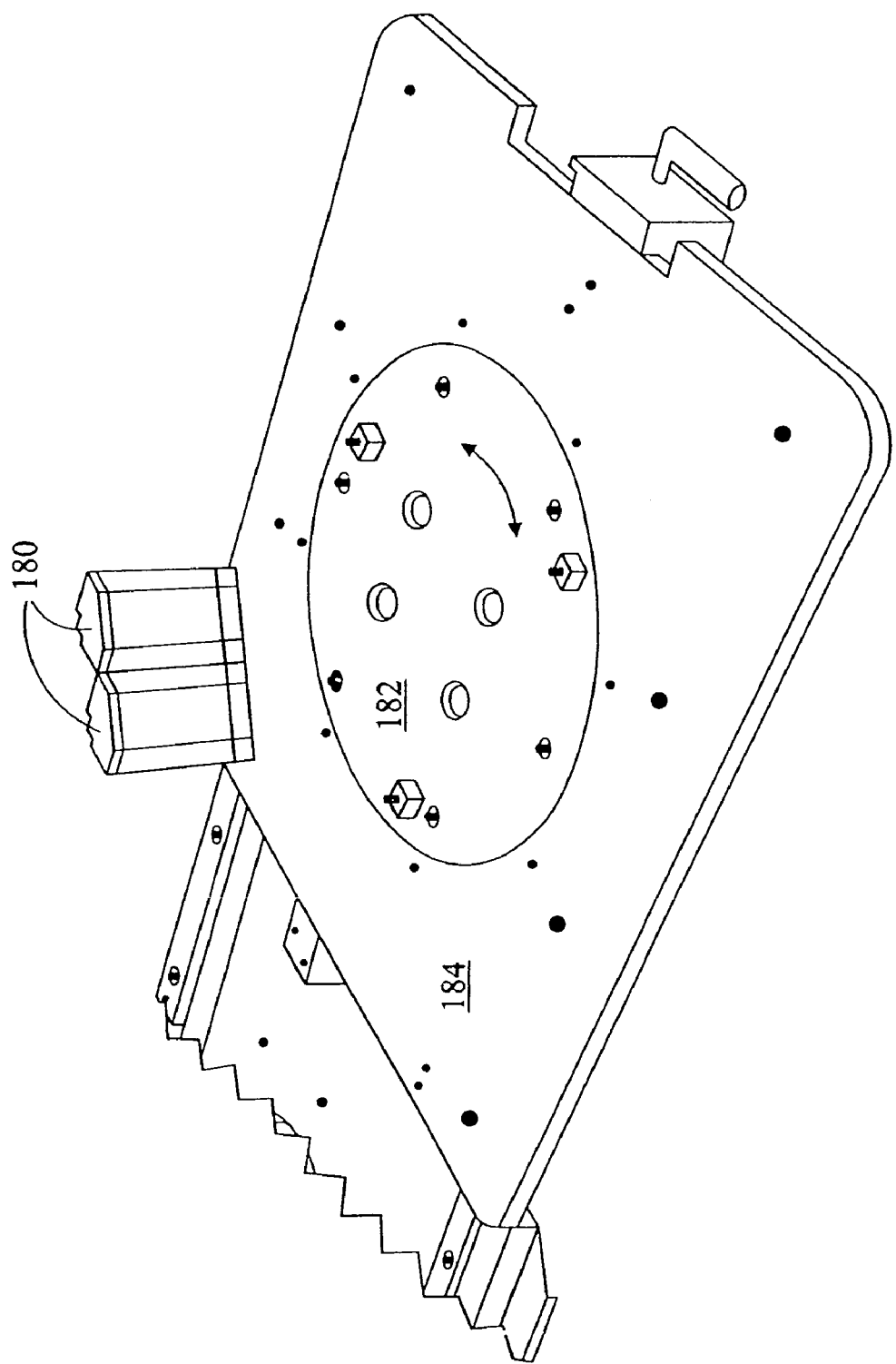
FIG. 8 illustrates an adjustment plate and a surrounding positional stage.

To overcome the limitations associated with misalignment of the theta orientation of the wafer, to reduce the size of the environmental control enclosure, and/or to simplify the compensation for the encoders over the X and Y movement, the present inventors came to the realization that the chuck supporting the wafer should rotate with respect to the auxiliary chuck, as illustrated by FIG. 8. FIG. 8 illustrates the adjustment plate 182 and a surrounding positional stage 184. Accordingly, auxiliary chucks 180 preferably maintain a fixed X and Y orientation with respect to the probe positioners and their respective probes. In this manner, the auxiliary chucks are always properly orientated with the probes positioners and the probes. During use, the chuck (supported by the adjustment plate 182) with a wafer thereon is rotated to the proper theta position with respect to the probes for probing the wafer. Thereafter, the theta adjustment of the chuck may remain stationary during subsequent probing of the wafer and recalibration using the auxiliary chucks. In this manner, typically the chuck assembly needs to only be moved in X, Y, and potentially Z directions to achieve complete probing of an entire wafer. Accordingly, the environmental control enclosure does not necessarily need to be sufficiently wide to accommodate rotation of the positional stage. Also, the encoder compensation may be simplified.

During probing with the chuck assembly 20, as described in the background, it became apparent that probing toward the edges of the wafer tended to result in "wobble" of the wafer and chuck assembly 20. In addition, some existing probe assemblies include the chuck assembly elements supported by a set of linear bearings that permit the upper chuck assembly elements together with the bearing to be slid out of the environment enclosure for loading the wafer onto the chuck assembly. The resulting structure is heavy, and positioned on top of and supported by a plunger affixed to the top of the Z-axis movement of the chuck assembly 20.

Figure 9:
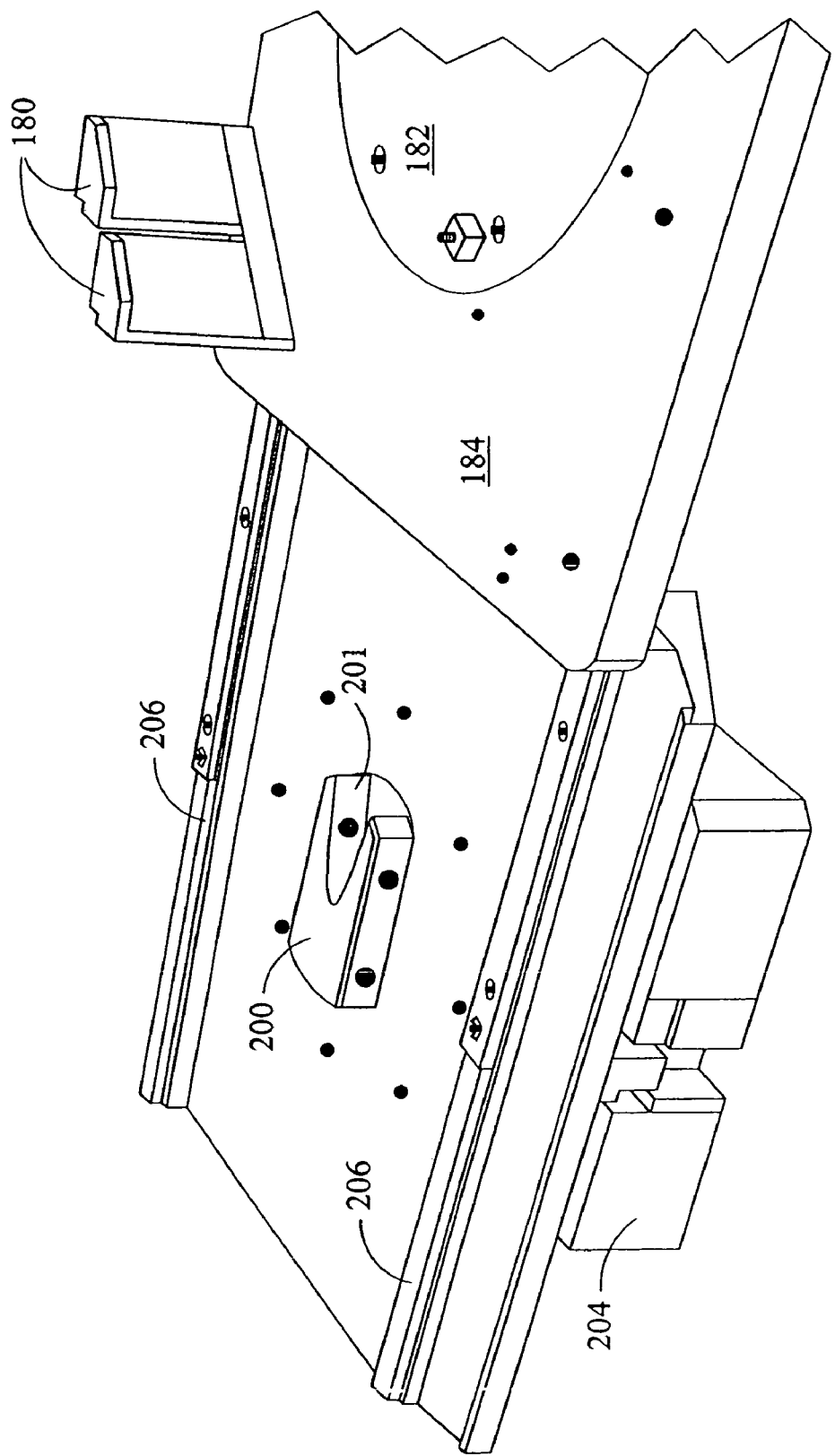
FIG. 9 illustrates an extended positional stage.

To reduce the wobble occurring during probing and reduce the stress applied to the plunger, the present inventors developed a modified arrangement to nearly eliminate the vertical loads on the plunger. Referring to FIG. 9, a modified arrangement includes a central plunger 200 providing rotational movement to the adjustment plate 182 and hence a chuck supported thereon. The central plunger 200 may include a receptacle 201 that moves within a tab 203. The positional stage 184 and auxiliary chucks 180 are supported by the stage 204 surrounding the central plunger 200 which provides the X, Y, and Z movement. Preferably, the stage includes the central plunger 200. The positional stage 184 includes an internal bearing (not shown) upon which the adjustment plate 182 rotates. Accordingly, the positional stage 184 is the primary load bearing member for the adjustment plate 182 and chuck thereon. Spaced apart linear bearings 206 provide a vertical and lateral load bearing support to the rotational chuck while the central plunger 200 provides the rotational movement to the chuck without (free from) being the primary load bearing member. The plunger 200 preferably maintains substantially constant vertical position with respect to the adjustment plate 182 when the stage 204 provides vertical "Z" movement of the positional stage.

Unlocking a lock permits the positional stage 184, including the rotational chuck, to slide out of the probe station for easier placement of wafers thereon. Normally when the positional stage 184 is extended, the wafer thereon is adjusted or otherwise replaced with a different wafer for subsequent testing. After repeated movement of the stage in and out of the probe station, together with rotational movement of the chuck (theta adjustment), the present inventors determined that the resulting theta movement of the chuck may be significantly different than the initial "zero" theta. In other words, after repeated use the adjustment plate 182 may be offset by a significant theta offset. Such significant potential theta offset may result in the cabling to the chuck, normally provided by a rollout service loop, being wound about the chuck assembly creating a significantly greater tension thereon or otherwise damaging the cabling or chuck. The adjustment plate 182 may include a rotational theta limit about "zero" to minimize potential damage. A suitable rotational limit may be ±7.5 degrees. A further limitation exists in the case that the adjustment plate 182 is rotated to a position near its rotational limit because the user may not be permitted further rotational movement in that direction when aligning another wafer thereby resulting in frustration to the user. To overcome these limitations the rotational orientation of the adjustment plate 182 (chuck) is returned to "zero" prior to sliding the positional stage 184 out of the probe station. In this manner, the chuck is always at a constant rotational position, such as 0 degrees, when a wafer is positioned thereon so that the likelihood of damaging the probe station by unintended tension on the wires and other interconnections to the chuck assembly is reduced. In addition, the range where the chuck is orientated prior to sliding out the positional stage 184 may be any predefined range of values. Also, the user maintains the ability to rotate the adjustment plate 182 as necessary during further alignment.

While the positional stage 184 is extended the user may attempt to rotate the adjustment plate 182. Unfortunately, this may result in difficulty engaging the tab 203 with the receptacle 201 when the positional stage 184 is retracted. This difficulty is the result of the rotation of the lunger 200 not likewise rotating the positional stage as in existing designs.

Figure 10:
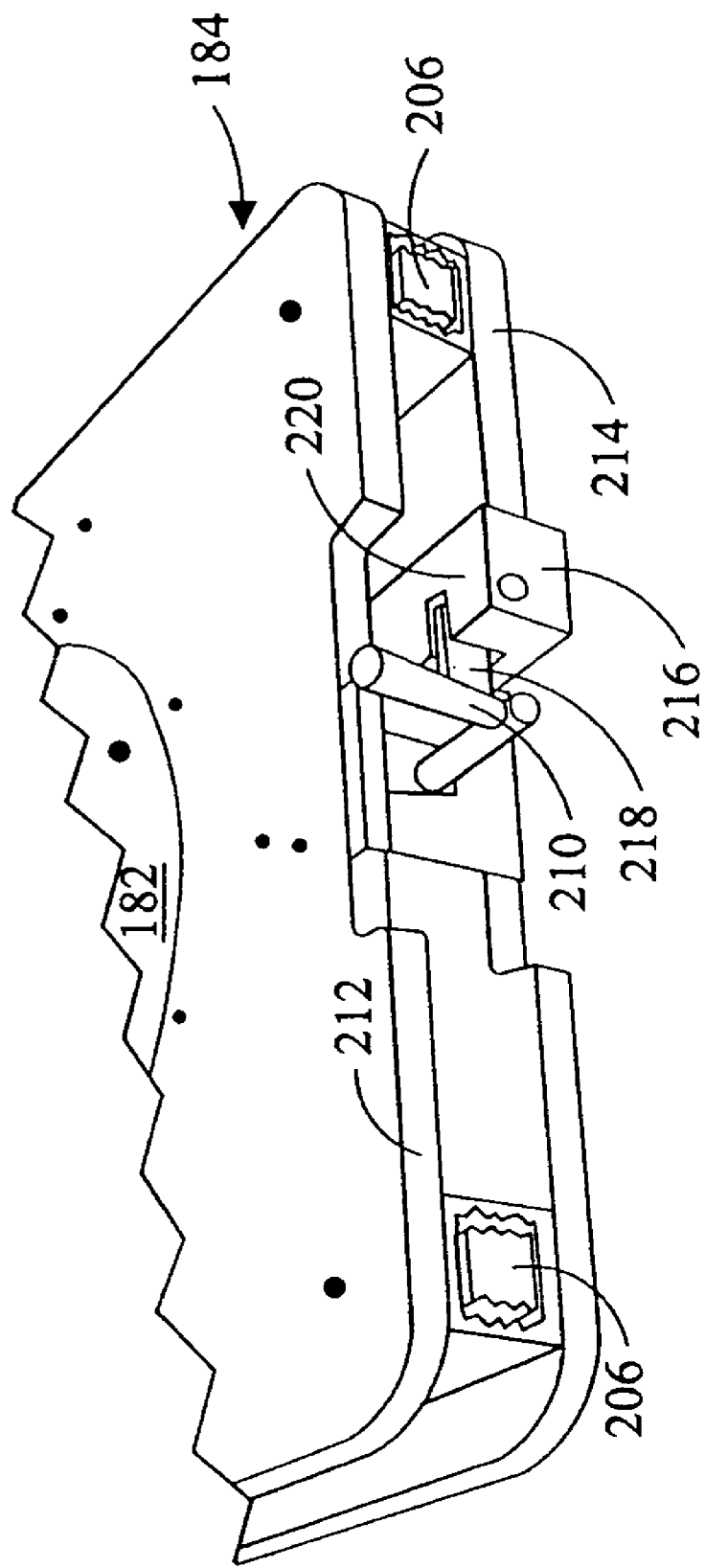
FIG. 10 illustrates a locking mechanism for the positional stage.

Referring to FIG. 10, the "zero" theta lockout may be provided by a mechanical arrangement together with a locking mechanism. A rotational handle 210 is secured to the upper plate 212 of the positional stage 184. A block 216 as secured to the lower plate 214 of the positional stage 184, which is rigidly attached to the housing 204. A finger 218 is inserted within a slot 220 defined by the block 216 to rigidly lock the upper plate 212 in position. The handle 210 is rotated to remove the finger 218 from the slot 220 to permit relative movement of the upper plate 212 with respect to the lower plate 214.

Figure 11:
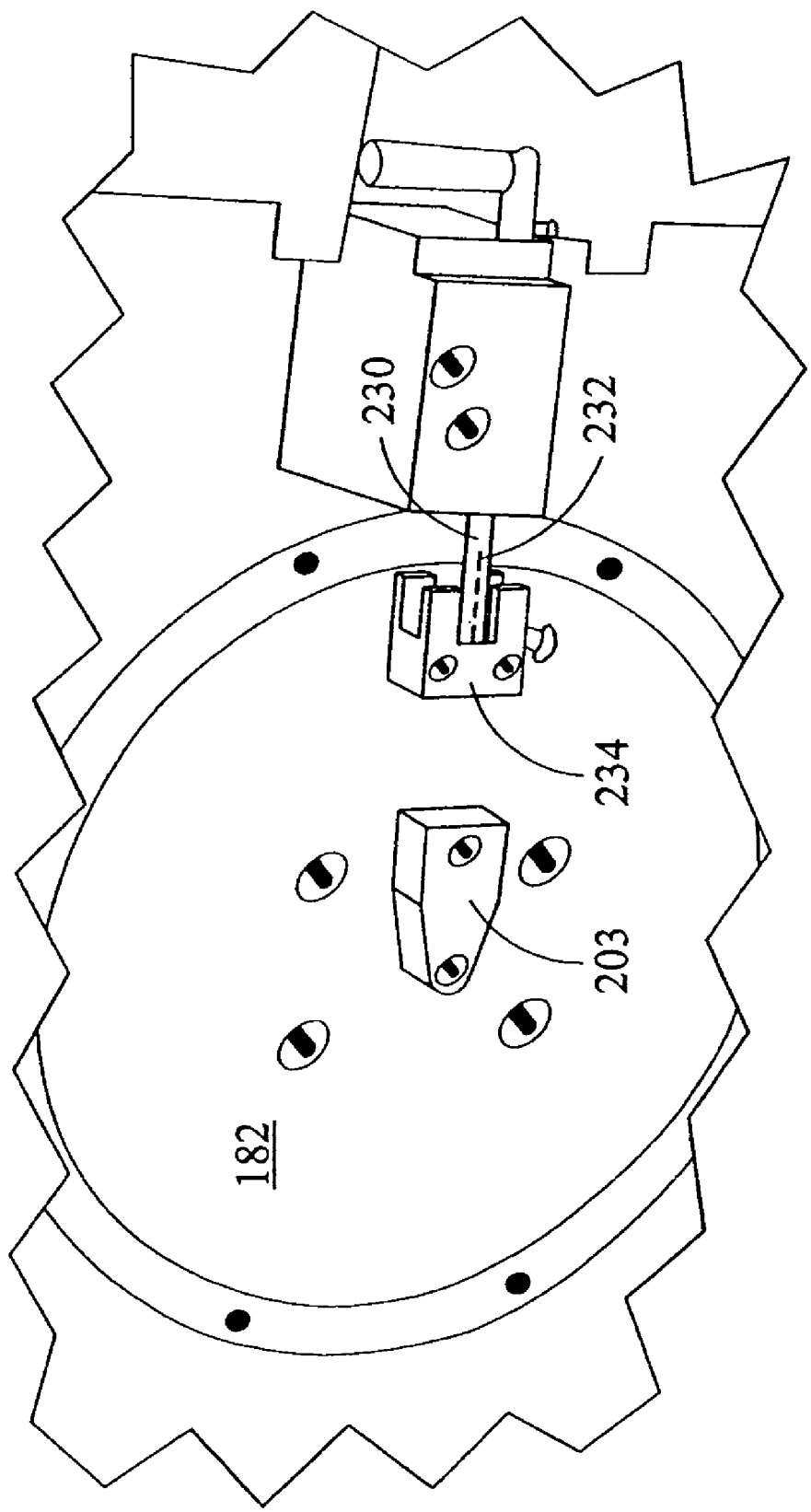
FIG. 11 illustrates a locking mechanism for the adjustment plate and a tab for rotational engagement of the adjustment plate.

Referring to FIG. 11, the handle 210 includes a shaft 230 with a slot 232 in the end thereof. With the handle 210 in the closed position, the slot 232 is aligned with an alignment plate 234 attached to the rear of the adjustment plate 182. The adjustment plate 182 may be rotated to properly align the wafer thereon, with the alignment plate 234 traveling within the slot 232. To unlock the handle 210 the adjustment plate 182 is realigned to "zero" thus permitting rotational movement of the handle 210, while simultaneously preventing rotational movement (substantially all) of the adjustment plate 182. It is to be understood that any suitable lock out mechanism may likewise be used.

Figure 12:
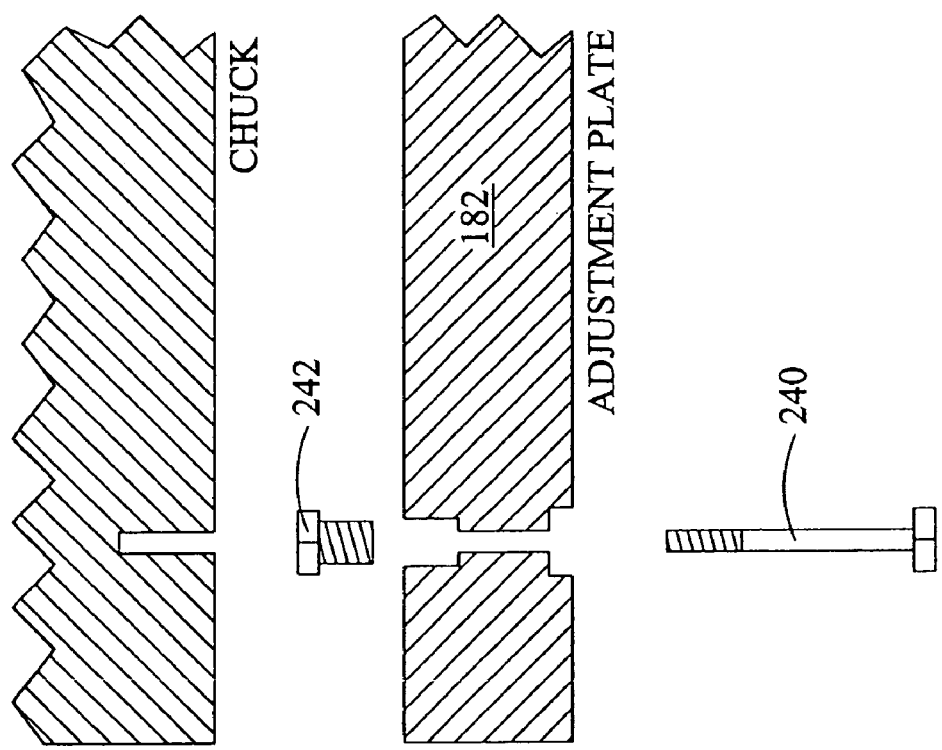
FIG. 12 illustrates traditional adjustment of the orientation of the chuck.

When one or more chuck assembly elements are supported by the adjustment plate 182, the upper surface of the chuck assembly should have a suitable orientation with respect to the probes, such as co-planar. Referring to FIG. 12, to adjust the orientation of the chuck assembly, the positional stage 184 is extended to provide convenient access to loosen threaded screws 240. The threaded screws 240 interconnect the chuck to the adjustment plate 182. Next an adjusting screw 242, such as a jack screw, is rotated to adjust the spacing between the adjustment plate and the chuck. Then the threaded screw 240 is tightened to rigidly secure the adjustment plate to the chuck. The positional stage is then slid back into the probe station and locked in place. At this point the actual orientation of the upper surface of the chuck assembly may be determined. Normally, the positional stage is adjusted several times to achieve accurate orientation. Unfortunately, this trial and error process of extending the positioning stage from the probe station, adjusting the orientation of the upper surface of the chuck assembly by adjusting one or more adjusting screws 242, and repositioning the positioning stage in the probe station, may take considerable time.

Figure 13:
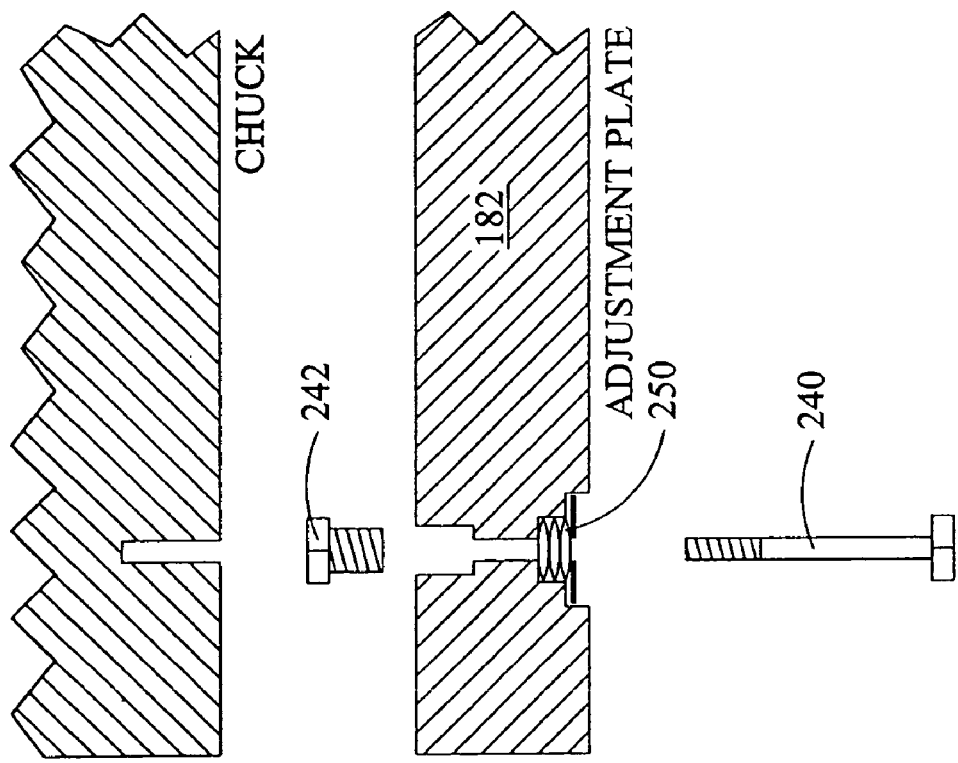
FIG. 13 illustrates a modified adjustment of the orientation of the chuck.

After consideration of this prolonged process of adjusting the orientation of the upper surface of the probe assembly, the present inventors came to the realization that loosening the threaded screw 240 relaxes the chuck from the adjustment plate 182. The amount of relaxation is hard to determine because the weight of the chuck assembly would make it appear that the chuck, jack screw, and adjustment plate are held together. Also, by adjusting the jack screw 242 and measuring the resulting movement of the chuck assembly provides an inaccurate result. In order to reduce the relaxation of the chuck and the adjustment plate, the present inventors determined that the threaded screw 240 should be tensioned so that the chuck does not significantly relax with respect to the adjustment plate. Referring to FIG. 13, one technique to tension the threaded screw is to provide a set of springs 250 under the head of the screw to provide an outwardly pressing force thereon when the threaded screw 240 is loosened. In this manner the relaxation between the chuck and the adjustment plate is reduced, resulting in a more accurate estimate of the adjustment of the orientation of the upper chuck assembly element. This reduces the frustration experienced by the operator of the probe station in properly orientating the chuck assembly. In addition, by loosening the threaded screws slightly, the chuck assembly may be more easily oriented by adjusting the jack screws while the probe station is in its locked position within the probe station. Thereafter, the positioning stage is extended and the threaded screws are tightened. It is to be understood that any structure may likewise be used to provide tension between the chuck assembly element and the adjustment plate while allowing adjustment of the spacing between the adjustment plate and the chuck assembly element, or otherwise adjusting the orientation of the chuck.

Normally it is important during testing to isolate the probe station from the earth and other nearby devices that may impose vibrations or other movement to the probe station, and hence the device under test. With proper isolation, the probe station may provide more accurate measurements. Typically the probe station is placed on a flat table having a surface somewhat larger than the probe station itself to provide a stable surface and reduce the likelihood of inadvertently sliding the probe station off the table. The table includes isolation, such as pneumatic cylinders, between the floor and the table surface. Also, it is difficult to lift the probe station onto the table in a controlled manner that does not damage the table and/or probe station. Further, the probe station is prone to being damaged by being bumped.

Figure 14:
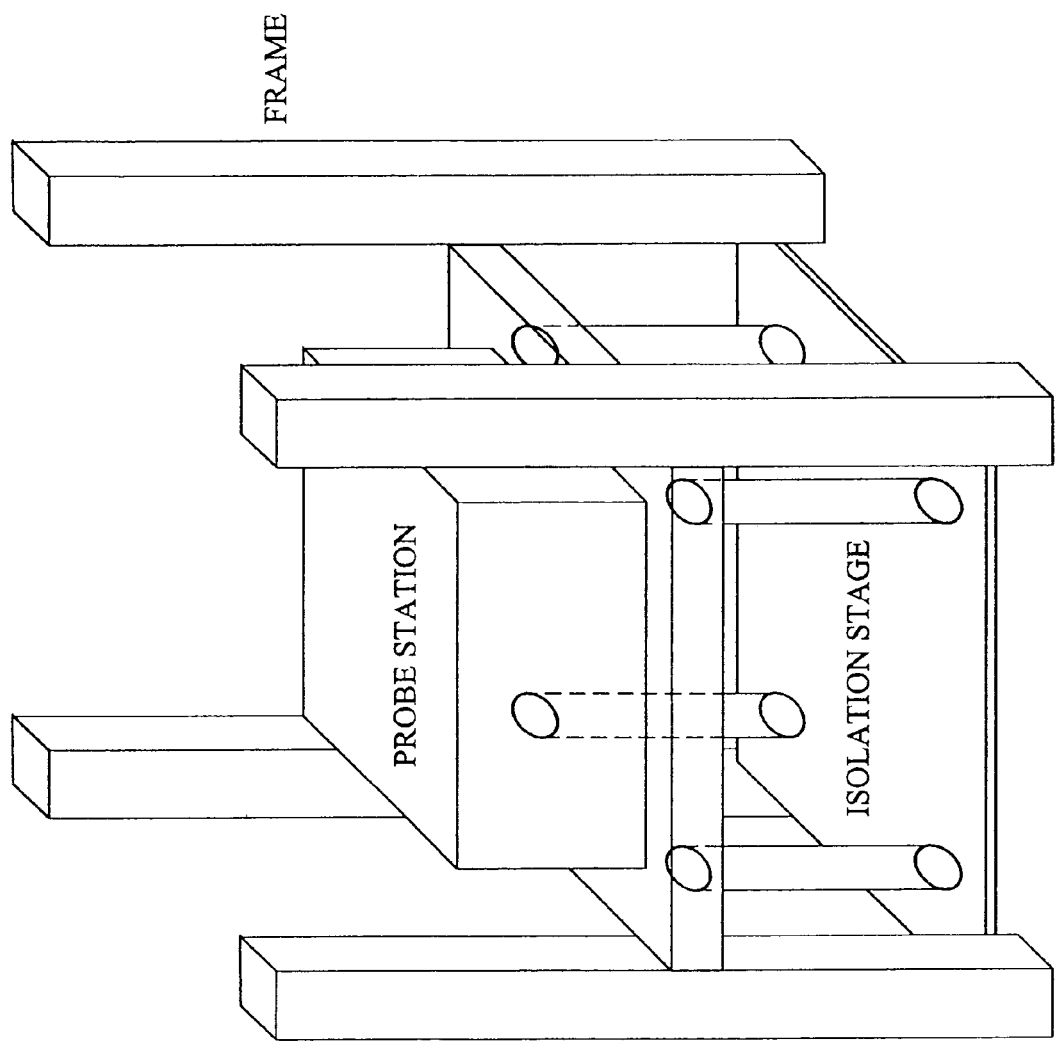
FIG. 14 illustrates a probe station supported by an isolation stage, both of which are surrounded by a frame.

To overcome the aforementioned limitations regarding the size of the probe station, the present inventors came to the realization that an integrated isolation stage, probe station, and frame provides the desired benefits, as illustrated in FIG. 14. The integrated isolation stage and probe station eliminates the likelihood of the probe station falling off the isolation stage. The top of the isolation stage may likewise form the base for the probe station, which reduces the overall height of the probe station, while simultaneously providing a stable support for the probe station. To protect against inadvertently damaging the probe station a frame at least partially surrounds the isolation stage and the probe station.

Figure 15:
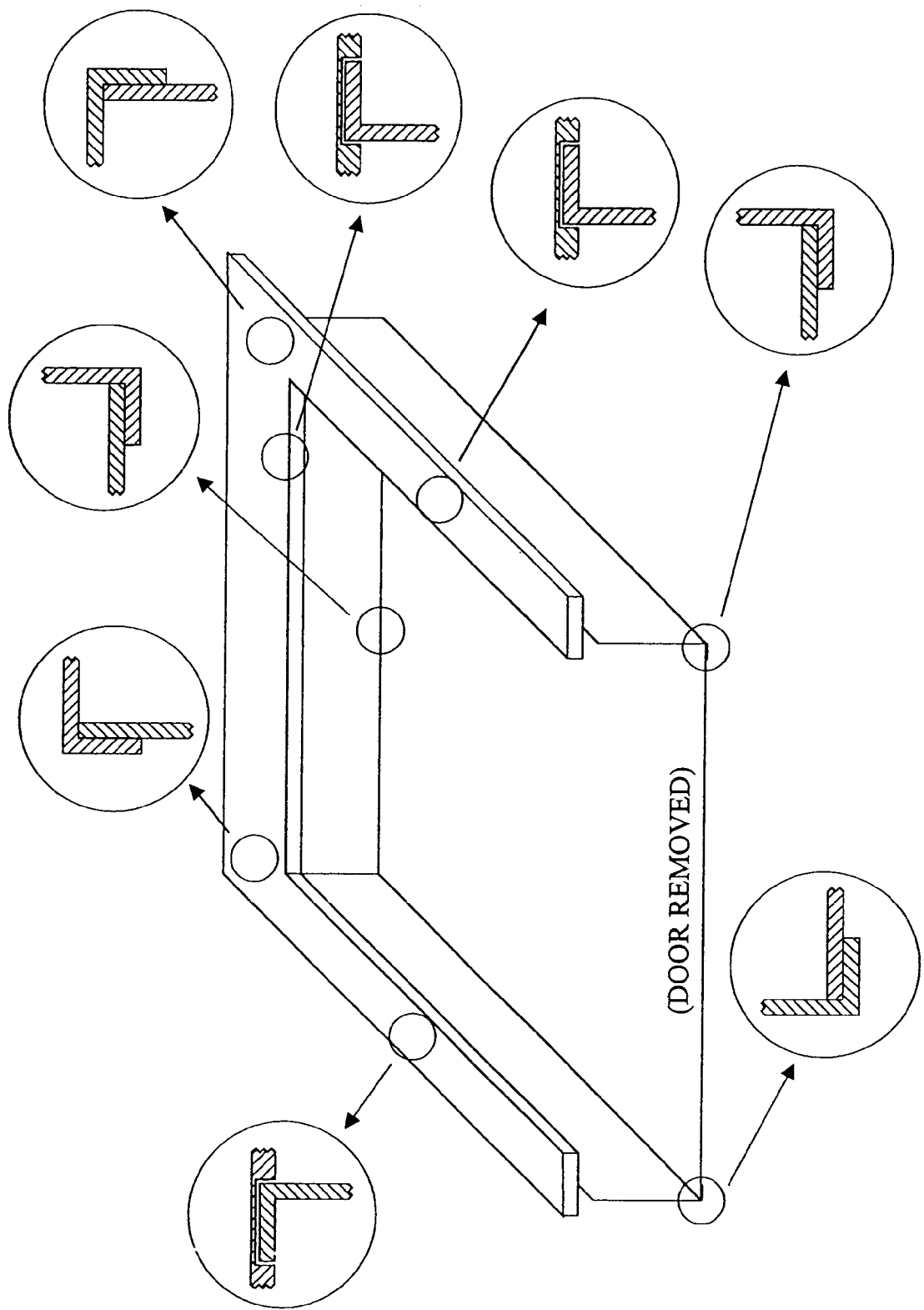
FIG. 15 illustrates the engagement of the sides of the environmental control enclosure.
Figure 16:
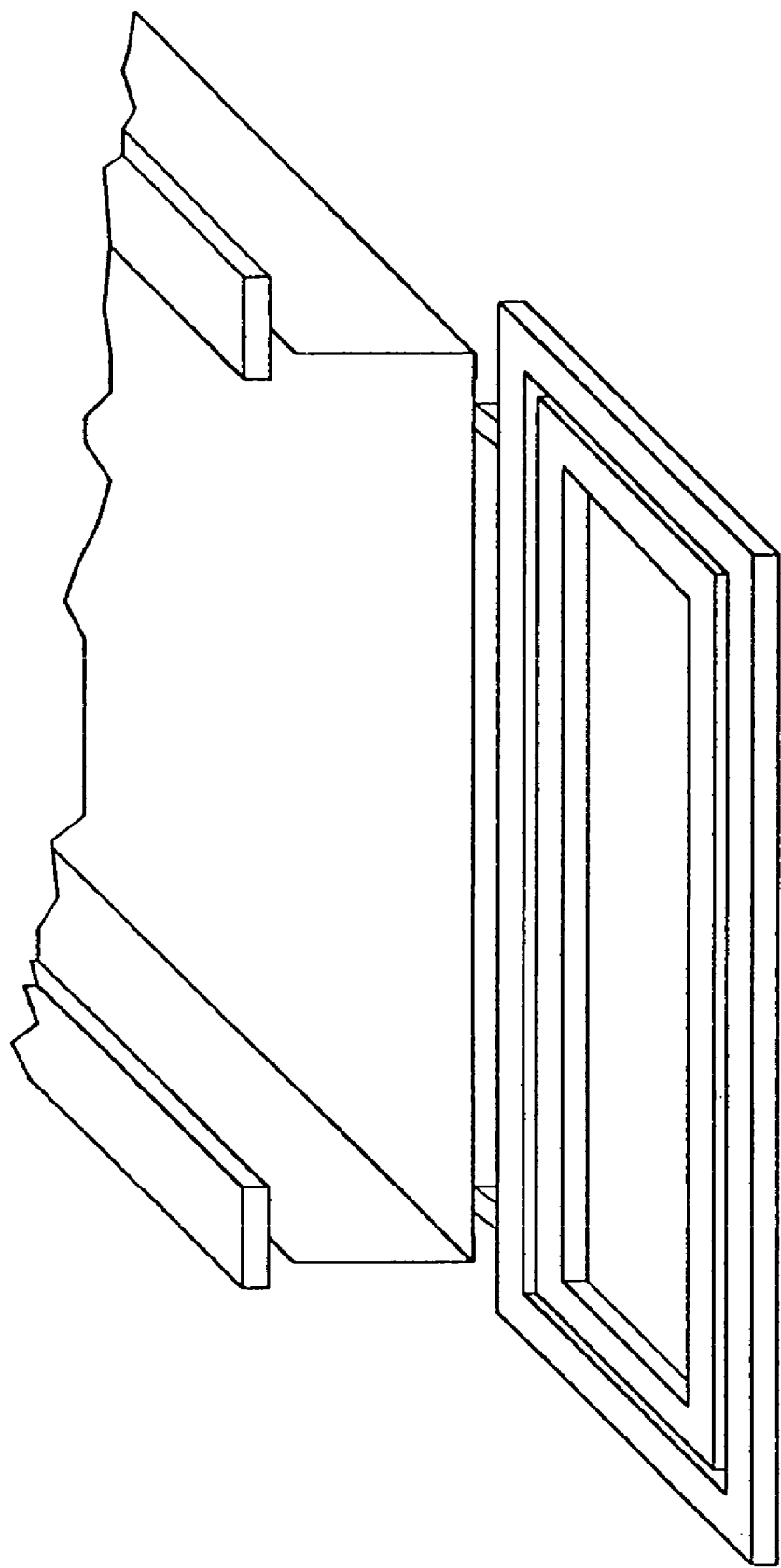
FIG. 16 illustrates the engagement of a door to the environmental control enclosure.

Even with extensive shielding and guarding existing environmental enclosures still seem to be inherently prone to low levels of noise. After consideration of the potential sources of noise, the present inventors determined that the construction of the environmental control enclosure itself permits small leakage currents to exist. Existing environmental control enclosures include one plate screwed or otherwise attached to an adjoining plate. In this manner, there exists a straight line path from the interior of the environmental control enclosure to outside of the environmental control enclosure. These joints are also prone to misalignment and small gaps there between. The gaps, or otherwise straight paths, provide a convenient path for leakage currents. Referring to FIGS. 15 and 16, to overcome the limitation of this source of leakage currents the present inventors redesigned the environmental control enclosure to include all (or substantial portion) joints having an overlapping characteristic. In this manner, the number of joints that include a straight path from the interior to the exterior of the environmental control enclosure is substantially reduced, or otherwise eliminated.

The invention claimed is:

1. A probe station for probing an electrical device with at least one probe needle, said probe station comprising:
 (a) a chuck having an upper surface capable of supporting an electrical device for probing by contact with the tip of said at least one probe needle;
 (b) an auxiliary chuck mounted to said probe station and configured to receive a calibration substrate at a location suitable for probing by contact with the tip of said at least one probe needle so as to calibrate test instrumentation used to test an electrical device supported by said chuck; and wherein
 (c) said chuck is capable of independent rotation relative to said auxiliary chuck.

2. The probe station of claim 1 where said auxiliary chuck has an upper surface substantially parallel with that of said chuck.

3. The probe station of claim 2 where the upper surfaces of said chuck and said auxiliary chuck, respectively, lie in substantially the same plane.

4. The probe station of claim 1 having a plurality of said auxiliary chucks.

5. The probe station of claim 4 where said plurality of auxiliary chucks are positioned around the periphery of said chuck.

* * * * *